(12) United States Patent
Co et al.

(10) Patent No.: US 7,863,159 B2
(45) Date of Patent: Jan. 4, 2011

(54) SEMICONDUCTOR DIE SEPARATION METHOD

(75) Inventors: Reynaldo Co, Scotts Valley, CA (US); DeAnn Eileen Melcher, San Jose, CA (US); Weiping Pan, Santa Clara, CA (US); Grant Villavicencio, Scotts Valley, CA (US)

(73) Assignee: Vertical Circuits, Inc., Scotts Valley, CA (US)

( * ) Notice: Subject to any disclaimer, the term of this patent is extended or adjusted under 35 U.S.C. 154(b) by 0 days.

(21) Appl. No.: 12/323,288

(22) Filed: Nov. 25, 2008

(65) Prior Publication Data

US 2009/0315174 A1    Dec. 24, 2009

Related U.S. Application Data

(60) Provisional application No. 61/132,708, filed on Jun. 19, 2008.

(51) Int. Cl.
*H01L 21/00* (2006.01)
(52) U.S. Cl. ............... 438/460; 438/462; 257/E21.599; 257/E21.602
(58) Field of Classification Search ................ 438/460, 438/462, 465; 257/E21.599, E21.602, E21.603
See application file for complete search history.

(56) References Cited

U.S. PATENT DOCUMENTS

| | | | |
|---|---|---|---|
| 5,691,248 A | 11/1997 | Cronin et al. | |
| 5,716,759 A | 2/1998 | Badehi | |
| 6,107,164 A | 8/2000 | Ohuchi | |
| 6,255,726 B1 | 7/2001 | Vindasius et al. | |
| 6,303,977 B1 | 10/2001 | Schroen et al. | |
| 6,338,980 B1 | 1/2002 | Satoh | |
| 6,582,992 B2 | 6/2003 | Poo et al. | |
| 6,624,505 B2 | 9/2003 | Badehi | |
| 6,706,971 B2 | 3/2004 | Albert et al. | |
| 6,722,213 B2 | 4/2004 | Offen et al. | |
| 6,777,767 B2 | 8/2004 | Badehi | |
| 6,908,784 B1 | 6/2005 | Farnworth et al. | |

(Continued)

OTHER PUBLICATIONS

International Search Report for PCT Appl No. US2009/047389, mailed Jan. 14, 2010.

(Continued)

*Primary Examiner*—Tuan N. Quach
(74) *Attorney, Agent, or Firm*—Haynes Beffel & Wolfeld LLP; Bill Kennedy

(57) ABSTRACT

According to the invention, die shift is reduced or substantially eliminated, by cutting the wafer in two stages. In some embodiments a first wafer cutting procedure is carried out prior to thinning the wafer to the prescribed die thickness; and in other embodiments the wafer is thinned to the prescribed die thickness prior to carrying out a first wafer cutting procedure. The first wafer cutting procedure includes cutting along a first set of streets to a depth greater than the prescribed die thickness and optionally along a second set of streets to a depth less than the die thickness. The result of the first cutting procedure is an array of strips or blocks of die, each including a plurality of connected die, that are less subject to shift than are individual singulated die. In a second wafer cutting procedure the die are singulated by cutting through along the second set of streets. Subsequent to the first cutting procedure, and prior to the second cutting procedure, additional die preparation procedures that are sensitive to die shift may be carried out.

24 Claims, 19 Drawing Sheets

U.S. PATENT DOCUMENTS

| | | |
|---|---|---|
| 6,910,268 B2 | 6/2005 | Miller |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 7,029,949 B2 | 4/2006 | Farnworth et al. |
| 7,215,018 B2 | 5/2007 | Vindasius et al. |
| 7,221,051 B2 | 5/2007 | Ono et al. |
| 7,259,455 B2 | 8/2007 | Seto et al. |
| 7,279,363 B2 | 10/2007 | Cherukuri et al. |
| 7,662,671 B2 * | 2/2010 | Saeki ............ 438/114 |
| 2001/0012725 A1 | 8/2001 | Maeda et al. |
| 2003/0122243 A1 | 7/2003 | Lee et al. |
| 2003/0143819 A1 * | 7/2003 | Hedler et al. ......... 438/462 |
| 2003/0209772 A1 | 11/2003 | Prabhu |
| 2004/0113283 A1 | 6/2004 | Farnworth et al. |
| 2004/0217446 A1 | 11/2004 | Headley et al. |
| 2004/0251520 A1 | 12/2004 | Sasaki et al. |
| 2005/0082651 A1 | 4/2005 | Farnworth et al. |
| 2005/0085050 A1 | 4/2005 | Draney et al. |
| 2005/0287709 A1 * | 12/2005 | Lee et al. ............ 438/122 |
| 2006/0068567 A1 | 3/2006 | Beyne et al. |
| 2006/0076690 A1 | 4/2006 | Khandros et al. |
| 2006/0278971 A1 | 12/2006 | Barnes et al. |
| 2007/0029684 A1 * | 2/2007 | Arai et al. ............ 257/E21.237 |

OTHER PUBLICATIONS

International Search Report for PCT Application No. PCT/US2008/067541, mailed Oct. 27, 2008.
International Preliminary Report on Patentability, PCT Application US2008/067541, mailed Jan. 7, 2010.
International Search Report for PCT Application No. PCT/US2008/065793, mailed Dec. 22, 2008.
International Search Report for PCT Application No. PCT/US2008/065788, mailed Sep. 30, 2008.
Office Action mailed Dec. 1, 2009, U.S. Appl. No. 12/142,589, titled "Wafer level sruface passication of stackable integrated circuit chips".
Amendment filed Mar. 1, 2010, U.S. Appl. No. 12/142,589, in response to Office Action mailed Dec. 1, 2009.
International Search Report for PCT Application No. PCT/US2008/067722, mailed Feb. 25, 2009.
International Search Report for PCT application No. PCT/US2008/079948, mailed Mar. 17, 2009.
International Search Report mailed Mar. 23, 2009, International Application No. PCT/US2008/74450.

* cited by examiner

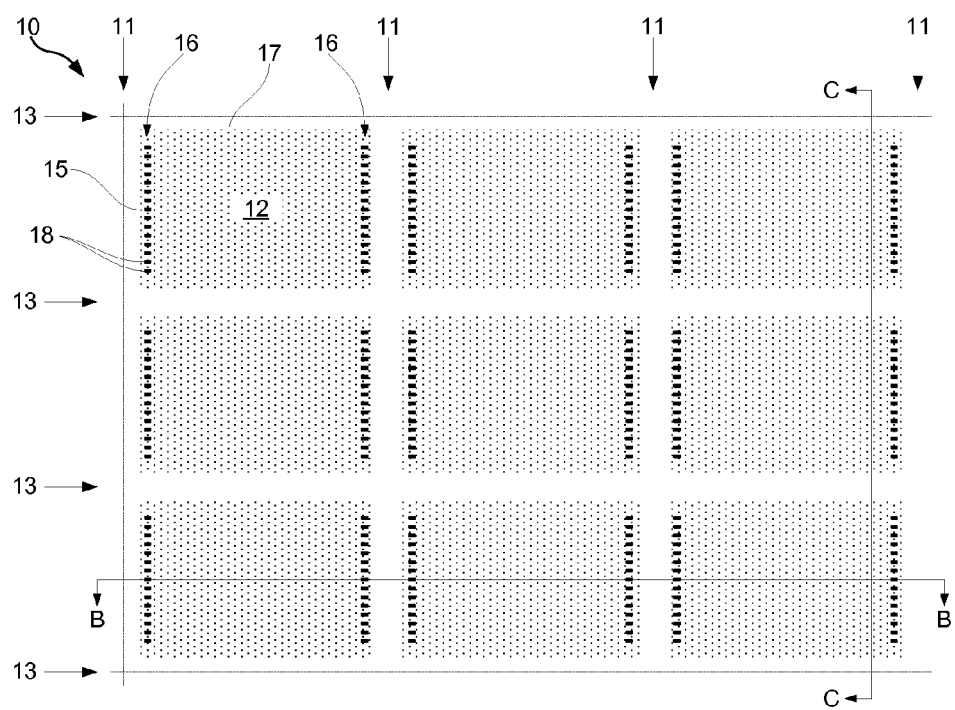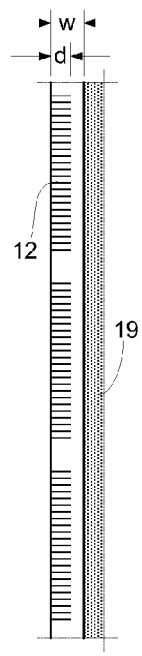
Fig. 1A    Fig. 1C
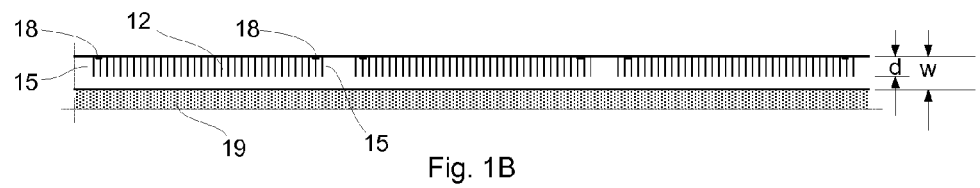
Fig. 1B

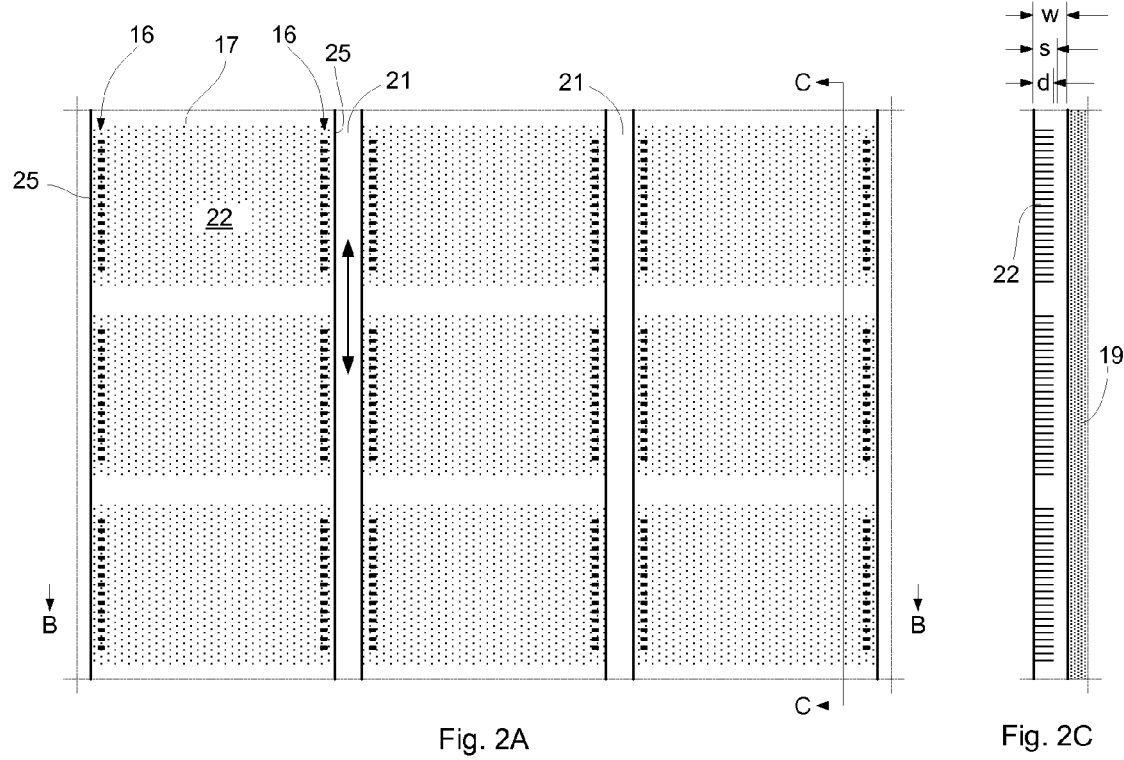
Fig. 2A
Fig. 2C
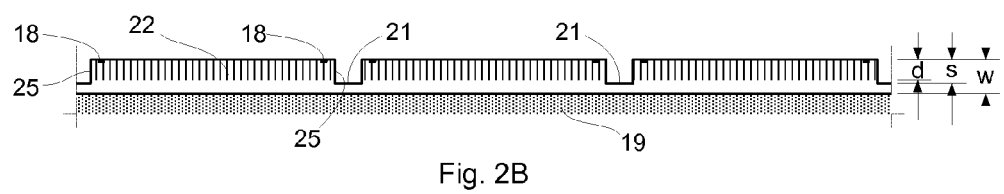
Fig. 2B

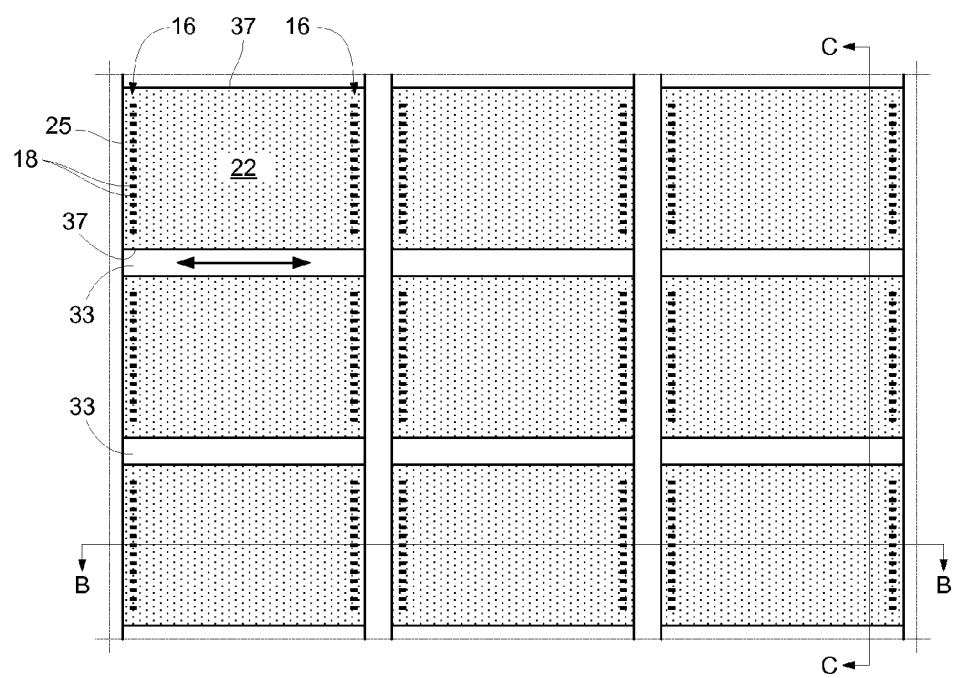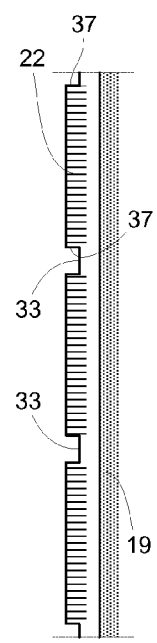
Fig. 3A
Fig. 3C
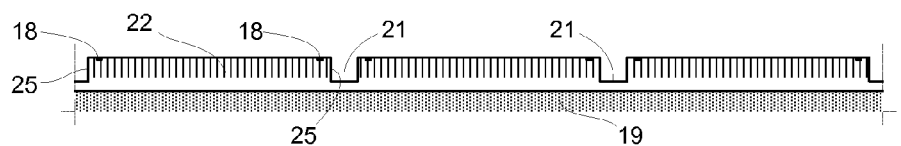
Fig. 3B

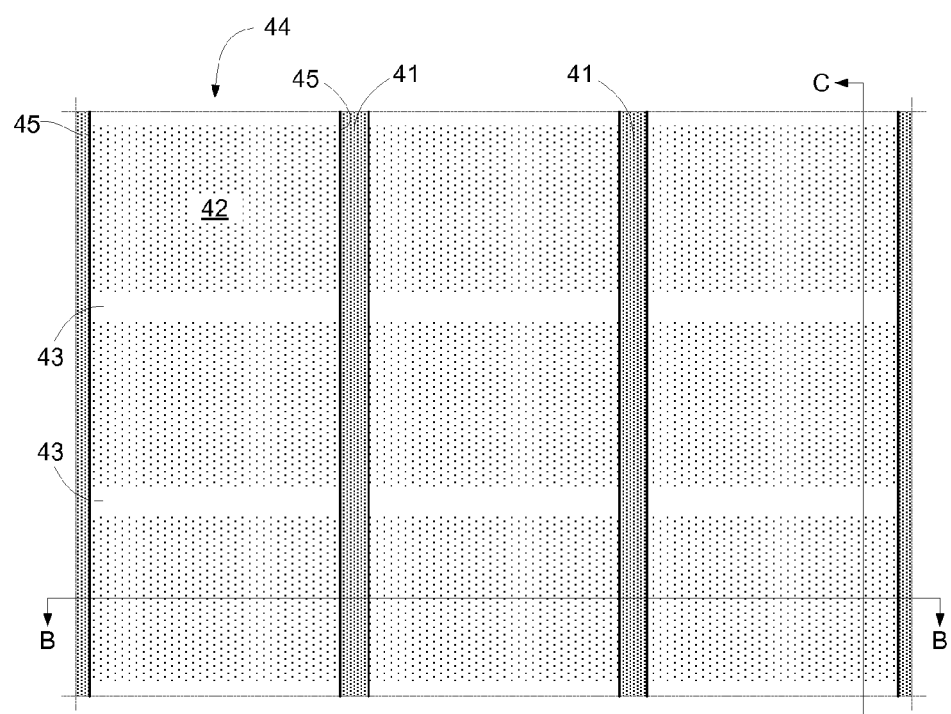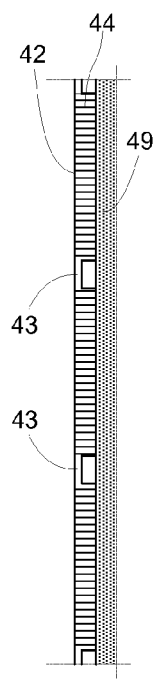
Fig. 4A
Fig. 4C
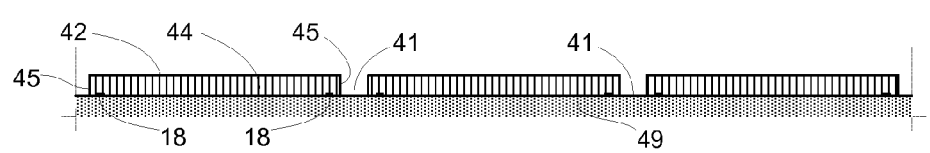
Fig. 4B

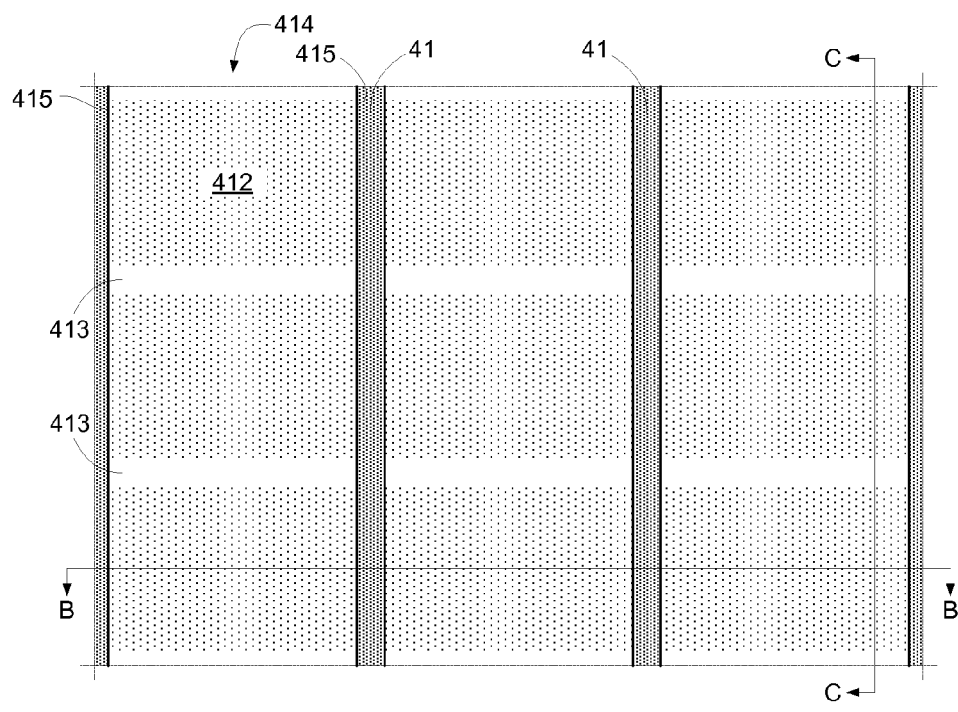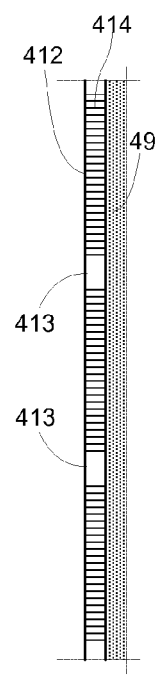
Fig. 4D        Fig. 4F
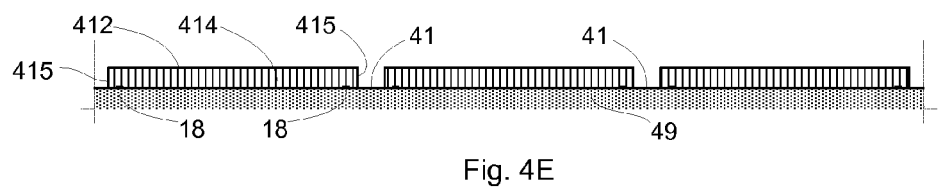
Fig. 4E

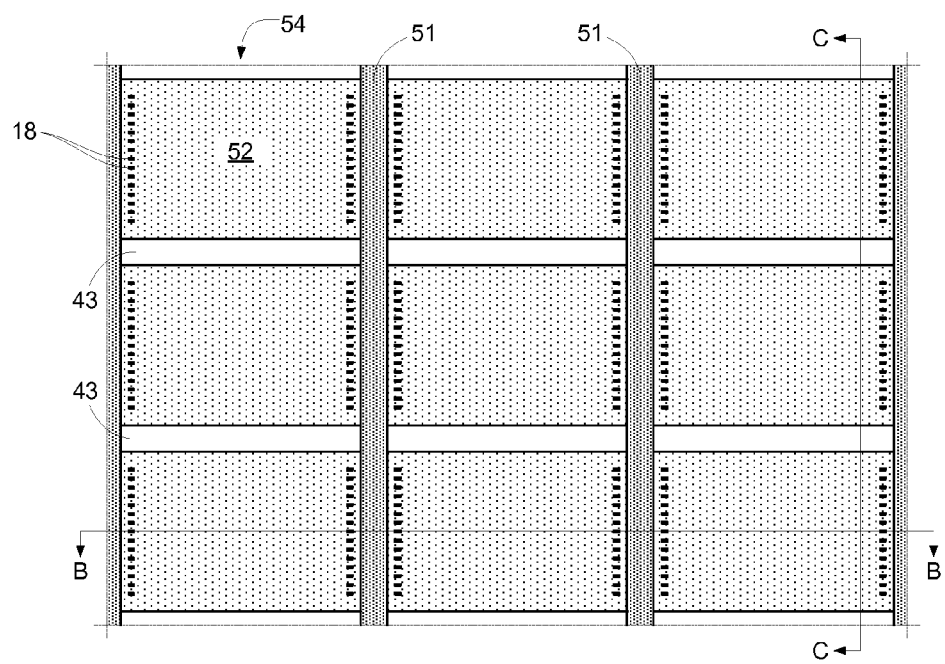 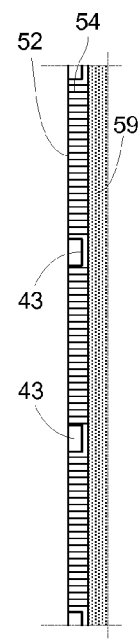
Fig. 5A   Fig. 5C
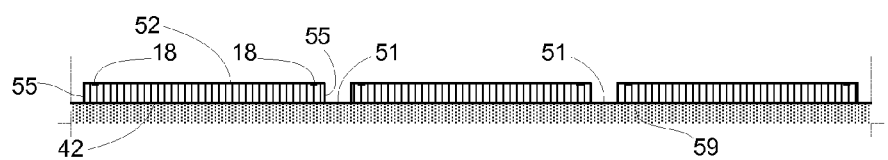
Fig. 5B

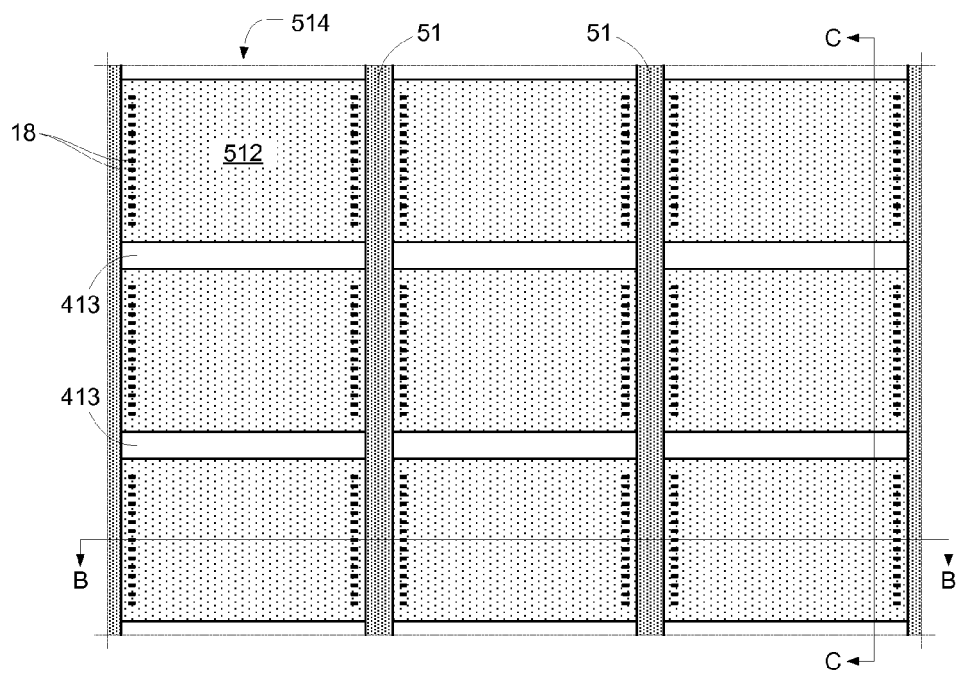 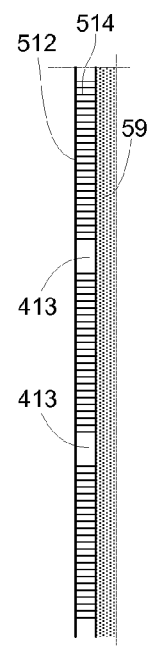
Fig. 5D  Fig. 5F
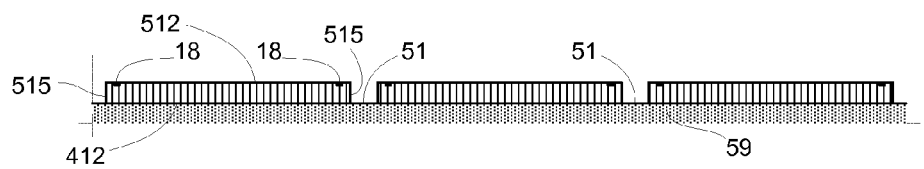
Fig. 5E

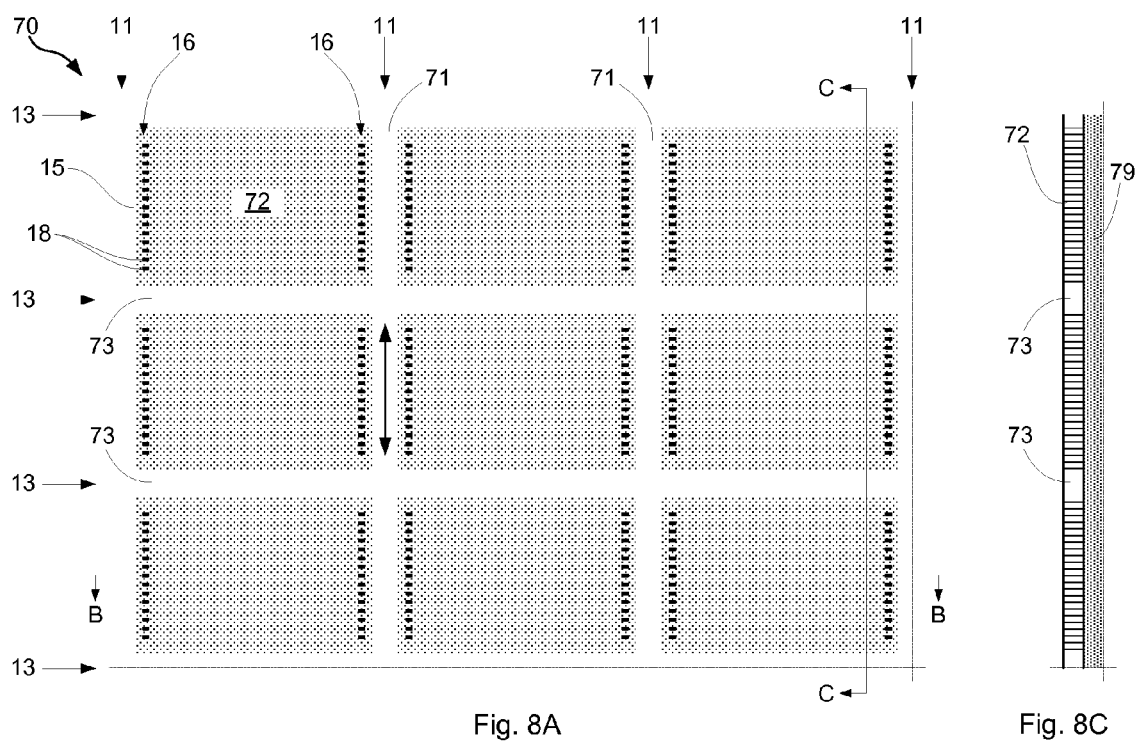
Fig. 8A
Fig. 8C
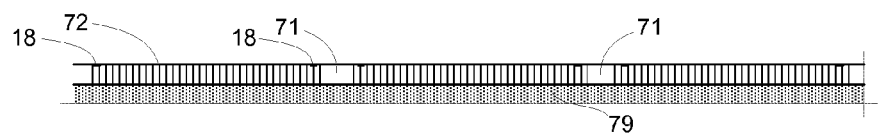
Fig. 8B

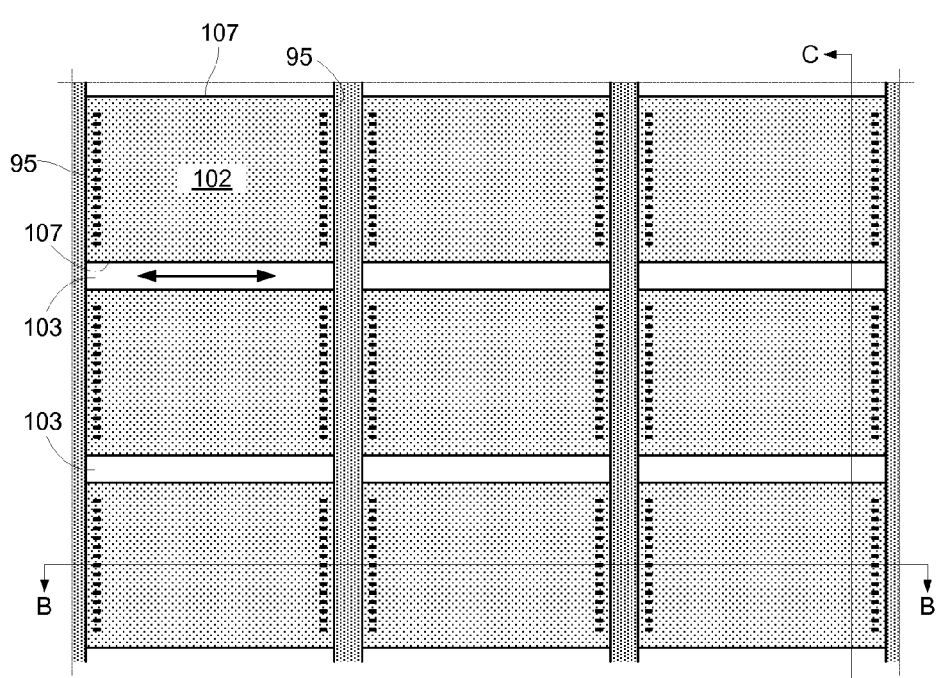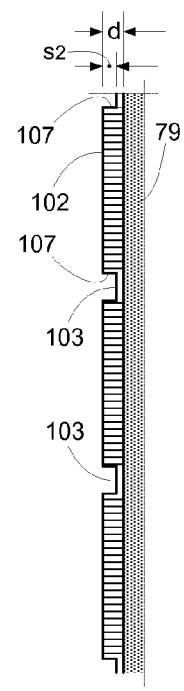
Fig. 10A  Fig. 10C
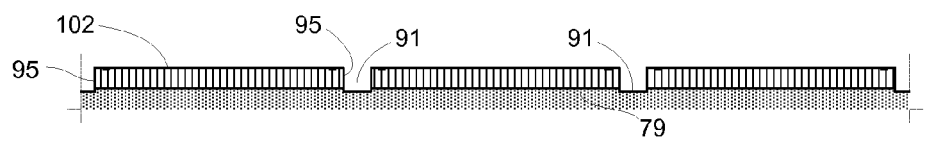
Fig. 10B

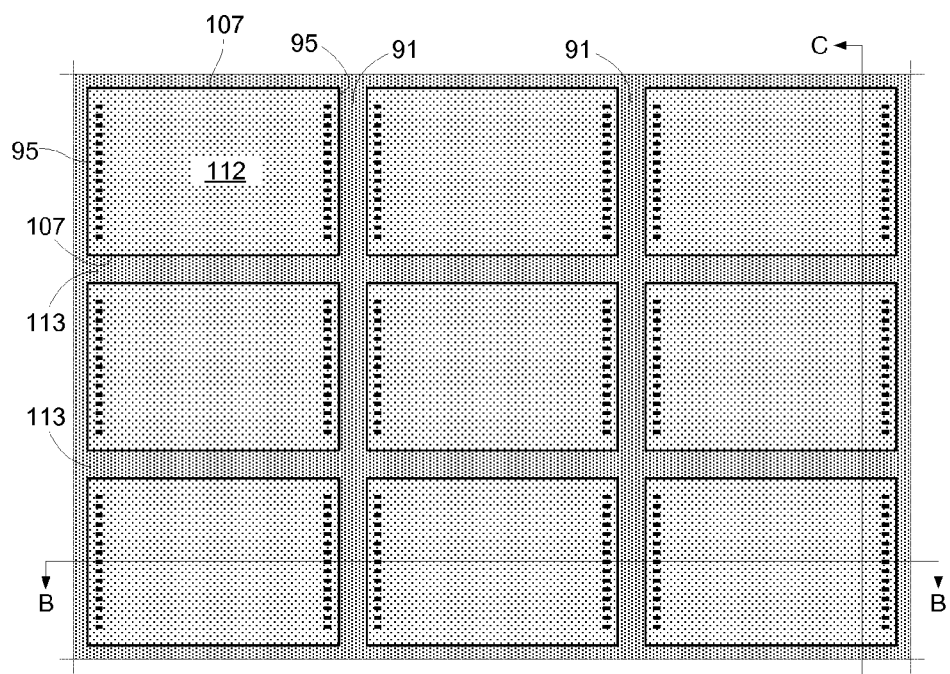
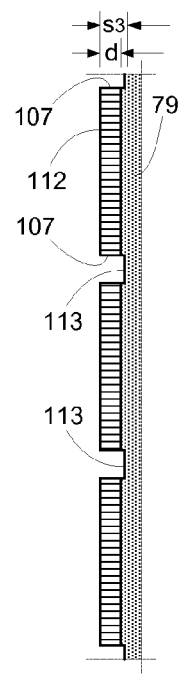
Fig. 11A
Fig. 11C
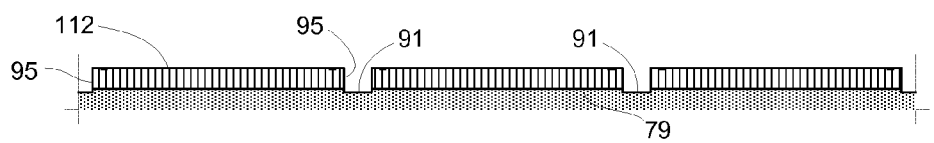
Fig. 11B

SEMICONDUCTOR DIE SEPARATION METHOD

CROSS-REFERENCE TO RELATED APPLICATIONS

This application claims priority from R. Co et al. U.S. Provisional Application No. 61/132,708, titled "Semiconductor die separation method", which was filed June 19, 2008, and which is hereby incorporated herein by reference.

This application is related to S. J. S. McElrea et al. U.S. Application No. 12/142,589, titled "Wafer level surface passivation of stackable integrated circuit chips", which was filed June 19, 2008, and which is hereby incorporated herein by reference.

BACKGROUND

This invention relates to semiconductor wafer processing and, particularly, to preparing singulated semiconductor integrated circuit die.

At some stage in die preparation, the wafer is cut to singulate the die. That is, the wafer is cut (for example, by sawing the wafer along "streets" between active circuit regions of the die), forming an array of die (a "wafer array") on the wafer support. The singulated die can then be manipulated individually (for example by use of a "pick-and-place" tool) for further treatment.

Many die preparation procedures can be carried out at the wafer level, that is, prior to die singulation. However, some procedures for preparing die require access to die sidewalls. For example, it may be necessary to provide electrical insulation over the die edge and sidewalls, to prevent shorting of the semiconductor body of the die with electrical conductors that may be employed for interconnection of the die, and that may contact the die edge or die sidewall.

Such procedures can be carried out on individual singulated die. However, for increased throughput it can be advantageous to carry out such procedures on the die prior to removing the die from the wafer array.

Typically, singulated die may shift on the support. Singulated die may rotate, for example, or may move in relation to the array and, as a result, the shifted die are no longer in proper register. In particular, movement of the dicing saw during the wafer cutting procedure may cause die to shift out of register.

Out-of-register die can present challenges for subsequent preparation of the die in the array.

For example, die shift may result in a narrowing of the spaces between the die in the array, so that the streets are narrowed at some places, or are not straight. Where a subsequent die preparation procedure calls for an additional pass of a cutting tool through the street, the tool may impact and damage shifted die during the additional pass. For example, it may be desirable to apply a die attach film to the backside of the die array, and then to cut the die attach film by passing a cutting tool through the streets in the array, resulting in an array of individual film-backed singulated die.

And, for example, die shift may result in displacement of features on the die out of register. Where a subsequent die preparation procedure calls for treatment of these features, the displaced features may be no longer accessible to equipment for carrying out the subsequent procedure. Shift of the features out of register may cause failure of such procedures. For example, it may be desirable using a patterned mask or stencil or an automated tool to address the interconnect pads on the die to apply an interconnect terminal, for example, or to remove a passivation layer that overlies the pads.

Die shift can in such instances frustrate an effort to increase throughput, by resulting in damaged die or in unsuccessful procedures.

SUMMARY

According to the invention, die shift is reduced or substantially eliminated, by cutting the wafer in two stages. In some embodiments a first wafer cutting procedure is carried out prior to thinning the wafer to the prescribed die thickness; and in other embodiments the wafer is thinned to the prescribed die thickness prior to carrying out a first wafer cutting procedure.

In the first wafer cutting procedure, cuts are performed along a set of streets to a depth at least as great as the prescribed die thickness; and, optionally, cuts are performed along another set of streets to a depth less than the prescribed die thickness. The cuts along the first set of streets result in die sidewalls, and the cuts along the second set of streets, where optionally made, result in partial sidewalls. The result of the first cutting procedure and wafer thinning is an array of rows of die (in some embodiments, blocks of die), where the rows or blocks are separated from one another, while the die within each row or block remain connected by the uncut portion of the wafer in the set of streets that were not cut or were cut to a depth less than the die thickness. The rows or blocks of die are less subject to shift than singulated die would be, primarily in part because they have a greater area of contact with the underlying wafer support. In a later cutting procedure the die are singulated by carrying out a second wafer cutting procedure along the second set of streets, passing completely through the thinned wafer array.

One or more die preparation procedures may be carried out following the first cutting procedure. Some such die preparation procedures may require access to selected die edges or die sidewalls. For example, it may be desirable to apply an electrically insulative coating to an interconnect die edge and/or to a die sidewall adjacent an interconnect die edge, to electrically protect the edge and/or the sidewall in the event of contact with an electrical interconnection wire or tab or trace. Accordingly, during the first wafer cutting procedure in such instances, the first set of streets (where the cutting is performed to a depth at least as great as the die thickness) includes the streets that are fronted by interconnect die edges. Other such die preparation procedures include an operation relating to features on the die, for example the die pads. For example, a previously applied passivation layer may cover the die pads, and for subsequent electrical connection at the pads it is necessary to selectively remove the passivation layer over the pads to reveal the pad surface for electrical contact. Or, for example, it may be desirable to attach an interconnect terminal at selected die pads, to facilitate subsequent electrical connection.

In one general aspect (first wafer cutting procedure before wafer thinning) the invention features a method for preparing singulated semiconductor die by: providing a wafer having a front side in which semiconductor chip active regions are formed, the active regions being bounded by saw streets, the active regions having interconnect pads arranged in an interconnect margin along an interconnect edge thereof; performing a first wafer cutting procedure, wherein cuts are made along a first set of streets from the front side to a depth at least as great as the prescribed die thickness and, optionally, cuts are performed along a second set of streets to a depth less than the prescribed die thickness; thereafter carrying out a die preparation procedure; and thereafter performing a second wafer cutting procedure along the second set of streets, passing completely through the thinned wafer array. The first wafer cutting procedure defines die edges, and performing the cuts to a depth at least as great as the die thickness in the first wafer cutting procedure defines die sidewalls. In some embodiments the first set of streets includes streets fronted by interconnect die edges, and performing the cuts to a depth at least as great as the die thickness defines interconnect edges and interconnect sidewalls. In some embodiments the die preparation procedure includes applying an electrical insulation onto at least the interconnect edges and in some embodiments the die preparation procedure includes applying an electrical insulation onto at least the interconnect sidewalls. In some embodiments the die preparation procedure includes applying an electrically insulating layer, such as a die attach film, onto the backside of the thinned wafer array. In some embodiments the die preparation procedure includes cutting a die attach film. In some embodiments the active side of the die are covered by a protective film, and the die preparation procedure includes forming openings in the film to expose features (such as die interconnect pads). In some embodiments the die preparation procedure includes mass processing of features in the interconnect pads, such as, for example, mass formation of bumps or other features on the interconnect pads, or mass coining of bumps on the interconnect pads, or mass formation of electrically conductive tabs or ribbons on the interconnect pads. In some embodiments the die preparation procedure includes mass processing of features in the interconnect pads, such as, for example, mass formation of bumps or other features on the interconnect pads, or mass coining of bumps on the interconnect pads, or mass formation of electrically conductive tabs or ribbons on the interconnect pads. Other die preparation procedures are contemplated.

In embodiments where a first wafer cutting procedure is carried out prior to thinning the wafer, in saw streets fronted by interconnect margins of the die, the wafer is cut to a depth in the wafer at least as great as the prescribed die thickness, so that the sidewalls along these streets are fully formed through the entire die thickness. Accordingly, these sidewalls are available for further treatment. In saw streets not fronted by interconnect margins of the die, the wafer may optionally (prior to carrying out a die preparation procedure) be cut only partway through the thickness of the wafer, so that the die are not fully severed during the wafer thinning procedure. Where the interconnect margins of the die in the wafer are all arranged along parallel streets running in one direction (the "N-S streets"), the thinning procedure results in an array of rows of die, in which the die in each row remain connected (at the "E-W streets") or partly connected (at the partly cut "E-W streets"), and in which the rows are separated by N-S streets. The rows or blocks of partly-severed die are less likely to shift out of register (die shift) than fully-singulated die. A later cutting procedure completes the separation of the die (die singulation). (As will be appreciated, the designations "N-S" and "E-W" herein are arbitrary and are made for convenient reference, and are not related to any particular view of the wafer.)

In another general aspect (wafer thinning before wafer cutting) the invention features a method for preparing singulated semiconductor die by: providing a wafer having a front side in which semiconductor chip active regions are formed, the active regions being bounded by saw streets, the active regions having interconnect pads arranged in an interconnect margin along an interconnect edge thereof; thinning the wafer to a die thickness; performing a first wafer cutting procedure, wherein cuts are made along a first set of streets from the front side to a depth at least as great as the prescribed die thickness (and, typically, all the way through the wafer) and, optionally, cuts are performed along a second set of streets to a depth less than the prescribed die thickness; thereafter carrying out a die preparation procedure; and thereafter performing a second wafer cutting procedure along the second set of streets, passing completely through the thinned wafer array. The first wafer cutting procedure defines die edges, and performing the cuts to a depth at least as great as the die thickness (and, typically, all the way through the wafer) in the first wafer cutting procedure defines die sidewalls. In some embodiments the first set of streets includes streets fronted by interconnect die edges, and performing the cuts to a depth at least as great as the die thickness defines interconnect edges and interconnect sidewalls. In some embodiments the die preparation procedure includes applying an electrical insulation onto at least the interconnect edges and in some embodiments the die preparation procedure includes applying an electrical insulation onto at least the interconnect sidewalls. In some embodiments the die preparation procedure includes applying an electrically insulating layer, such as a die attach film, onto the backside of the thinned wafer array. In some embodiments the die preparation procedure includes cutting a die attach film. In some embodiments the active side of the die are covered by a protective film, and the die preparation procedure includes forming openings in the film to expose features (such as die interconnect pads). In some embodiments the die preparation procedure includes mass processing of features in the interconnect pads, such as, for example, mass formation of bumps or other features on the interconnect pads, or mass coining of bumps on the interconnect pads, or mass formation of electrically conductive tabs or ribbons on the interconnect pads. Other die preparation procedures are contemplated.

In embodiments where the wafer is thinned to die thickness before cutting, in saw streets fronted by interconnect margins of the die the wafer is cut entirely through the thinned wafer, so that the die sidewalls along these streets are fully formed through the entire die thickness. Accordingly, these sidewalls are available for further treatment. In saw streets not fronted by interconnect margins of the die, the wafer may optionally (prior to carrying out a die preparation procedure) be cut only partway through the thinned wafer, so that the die are not fully severed (or are not severed at all) at these streets. Where the interconnect margins of the die in the wafer are all arranged along parallel streets running in one direction (the "N-S streets"), the partial cut results in an array of rows of die, in which the die in each row remain connected (at the uncut "E-W streets") or partly connected (at the partly cut "E-W streets"), and in which the rows are separated by N-S streets. The rows or blocks of partly-severed (or not severed) die are less likely to shift out of register (die tilt) than fully-singulated die. A later cutting procedure through the semiconductor material of the die completes the separation of the die (die singulation).

In another aspect the invention features an array of rows of semiconductor die (in some embodiments, blocks of die) on a wafer support, the rows or blocks of die being separated at a first set of streets, and the die in each row or block being connected by wafer material in a second set of streets.

In some embodiments an electrically insulative film is applied onto the exposed backsides of the array of rows of die (in some embodiments, blocks of die), and the die are singulated by cutting through the film. Cutting can be accomplished by, for example, a mechanical technique (sawing, breaking, tearing); or laser cutting or ablation; or water jet cutting; or by a combination of cutting techniques.

In some such embodiments the electrically insulative film includes an adhesive film, such as a die attach adhesive film, a thermal management film, or any film configured as media for attachment to, for example, a printed circuit board, or other die, or a substrate.

The methods of the invention can be used to prepare semiconductor die for any of a variety of devices, including for example stacked die assemblies, multiple chip modules, biomedical components, optoelectronics apparatus, MEMS, and vertically interconnected semiconductor assemblies. The devices may be used, for example, for building computers, telecommunications equipment, and consumer and industrial electronics devices.

In another aspect the invention features an assembly including a stack of devices as described above, electrically interconnected die-to-die.

In another aspect the invention features an assembly including a die or a stack of die as described above, electrically interconnected to underlying circuitry (for example in a substrate or a circuit board).

The assemblies according to the invention can be used for building computers, telecommunications equipment, and consumer and industrial electronics devices.

BRIEF DESCRIPTION OF THE DRAWINGS

FIGs. 1A-1C; 2A-2C; 3A-3C; 4A-4F; 5A-5F; and 6A-6C are diagrammatic sketches showing stages in embodiments of a process for providing singulated die in a wafer array.

In the preceding FIGs., the corresponding FIGs. labeled "A" (where presented) are in a plan view, and FIGs. labeled "B" and "C" (where presented) show sections taken generally perpendicular to one another; for example, the orientation of the sectional view shown in FIG. 1B is indicated at B-B in FIG. 1A, and the orientation of the sectional view shown in FIG. 1C is indicated at C-C in FIG. 1A. Also, in the preceding FIGs., the corresponding FIGs. labeled "D", "E" and "F" (where presented), illustrate alternative stages of a process.

Figure 12:
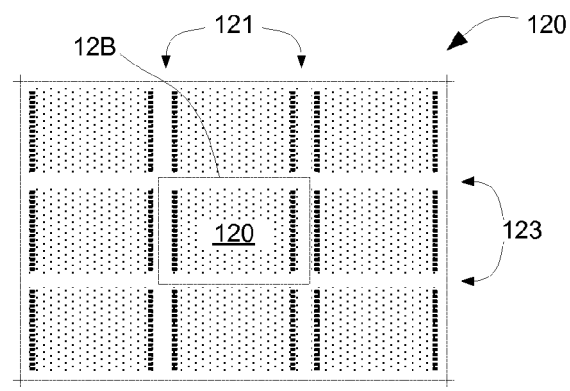

FIG. 12 is a diagrammatic sketch in a plan view showing a portion of the front (active) side of a semiconductor wafer having integrated circuit chip regions.

Figures 13A, 14A:
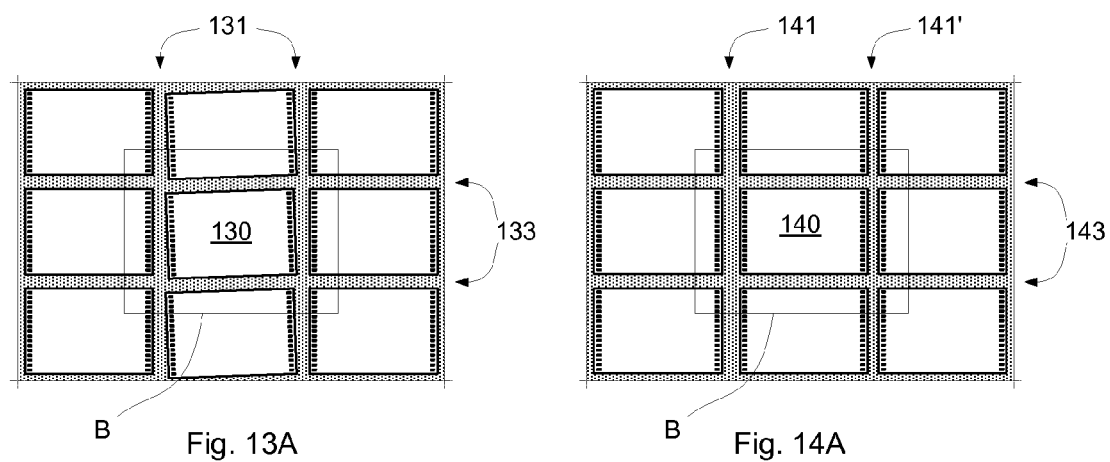

FIGS. 13A and 14A are diagrammatic sketches in a plan view showing singulated semiconductor die in a portion of an array formed by sawing a wafer as in FIG. 12 in a conventional manner illustrating die shift.

Figure 14B:
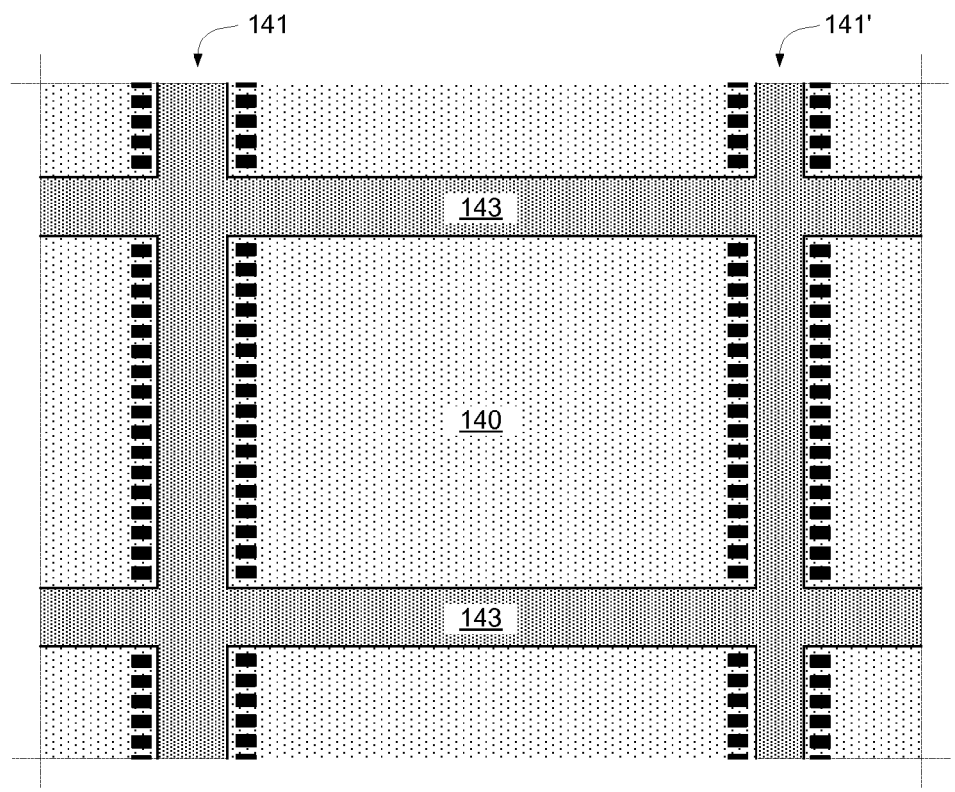
Figure 13B:
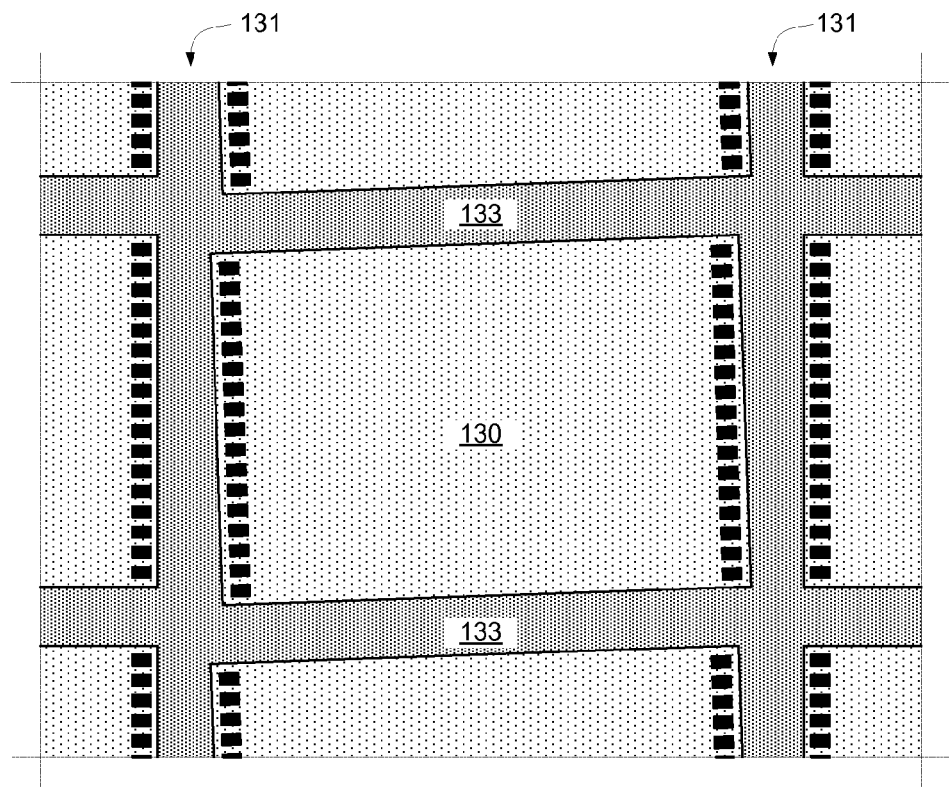

FIGS. 13B and 14B are diagrammatic sketches in a plan view showing the outline portions marked B in FIGS. 13A and 14A, respectively, enlarged.

Figure 15A:
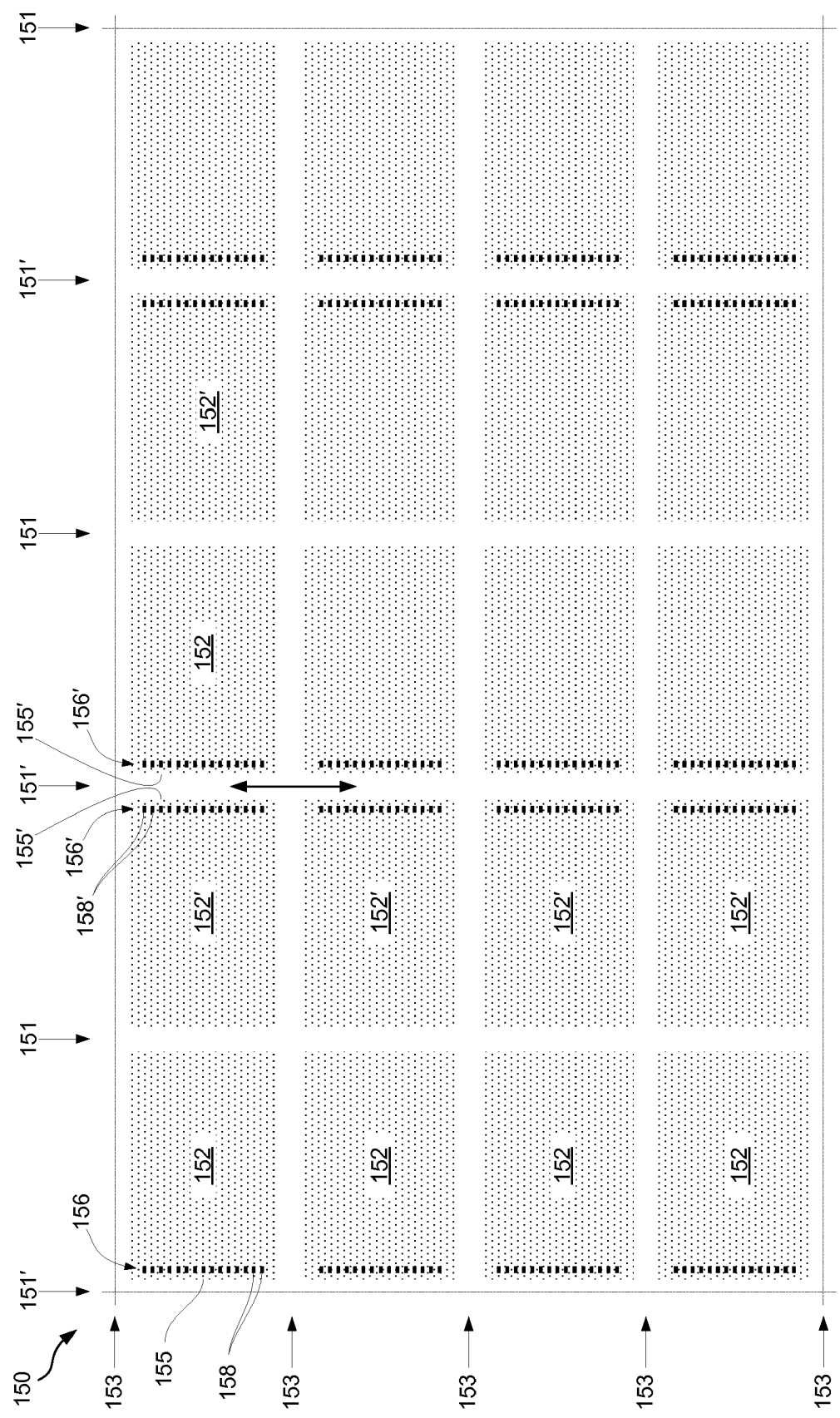
Figure 16A:
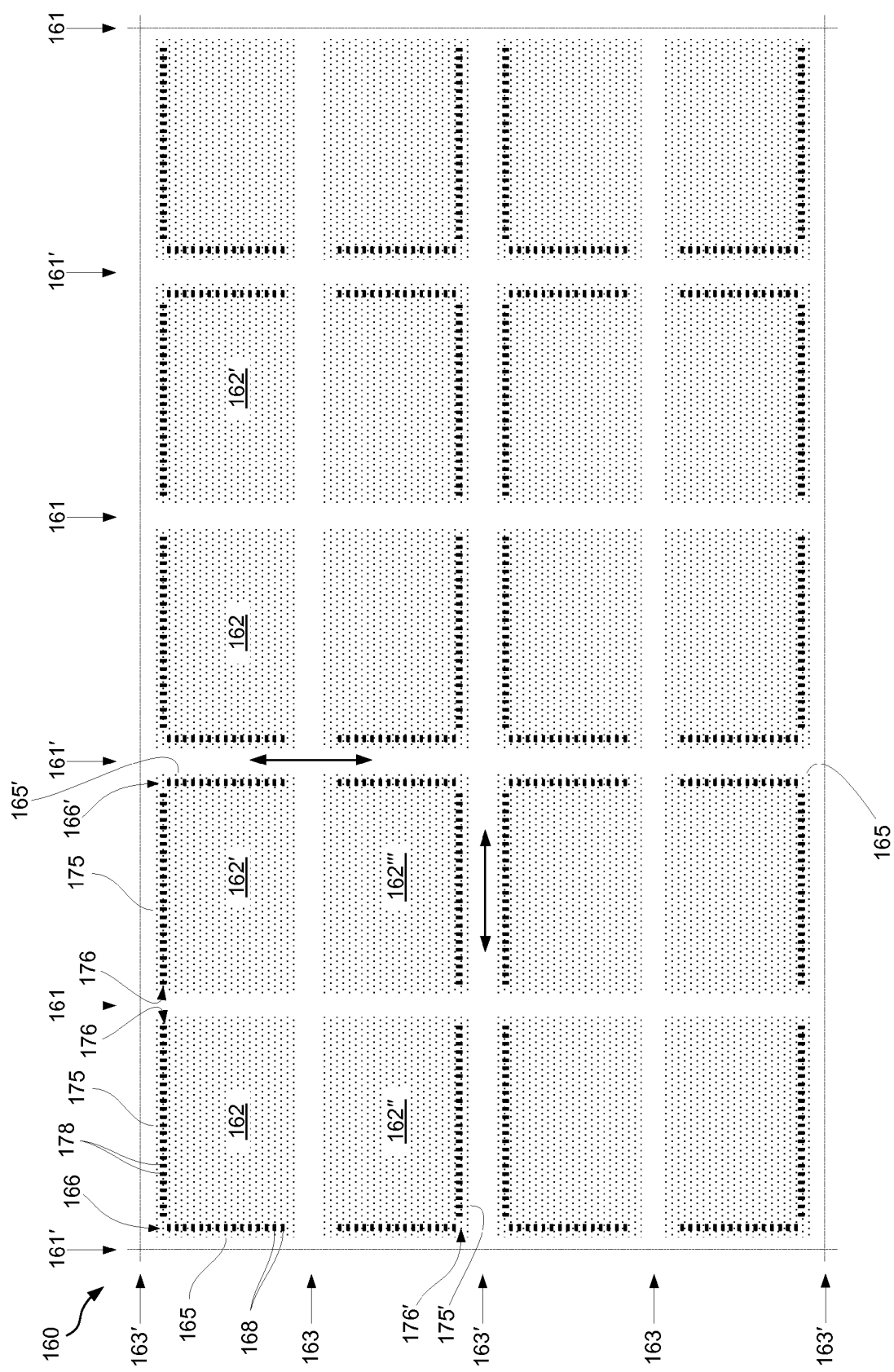

FIGS. 15A and 16A are diagrammatic sketches in plan view each showing a portion of the front (active) side of a semiconductor wafer having integrated circuit chip regions.

Figure 15B:
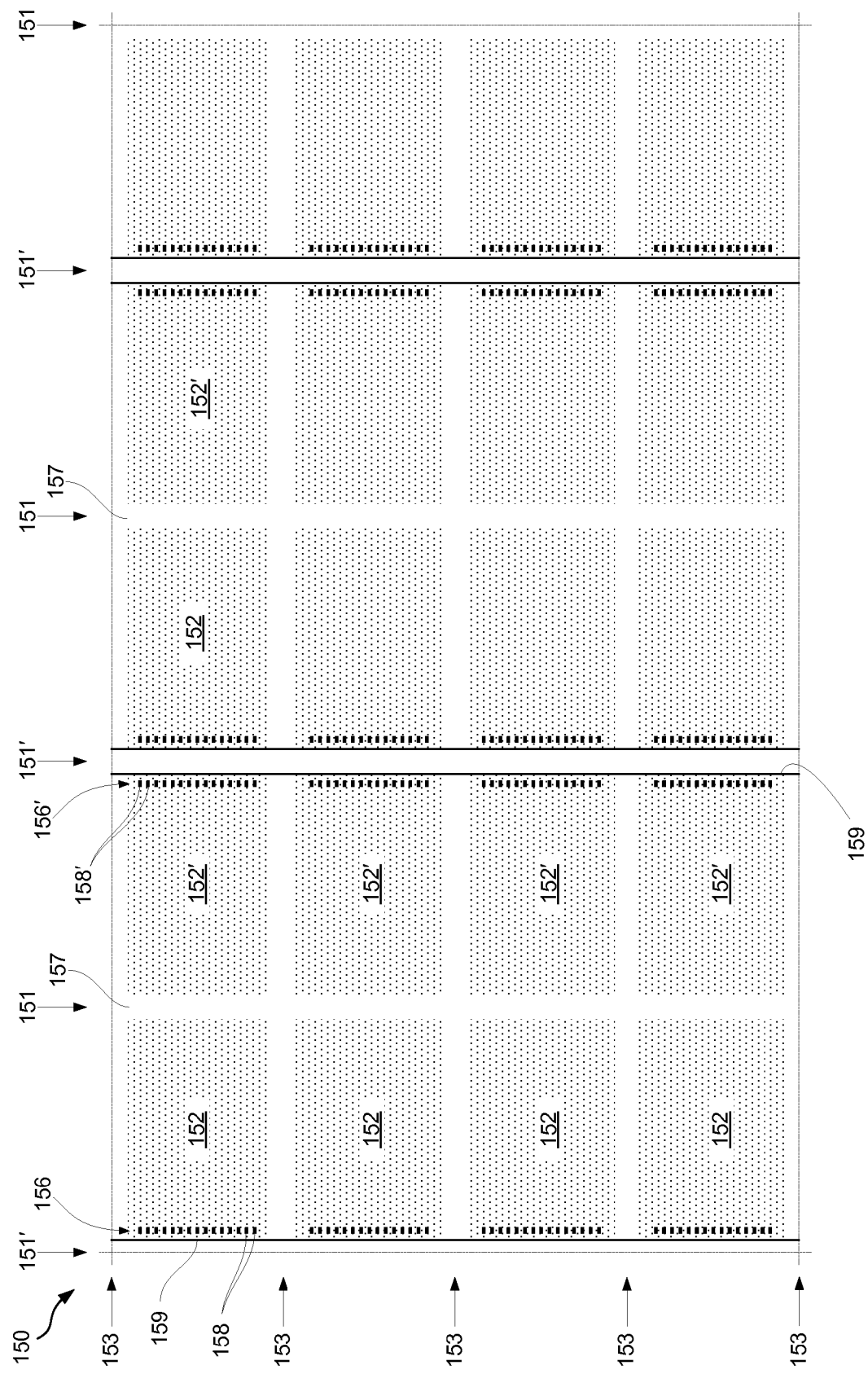
Figure 16B:
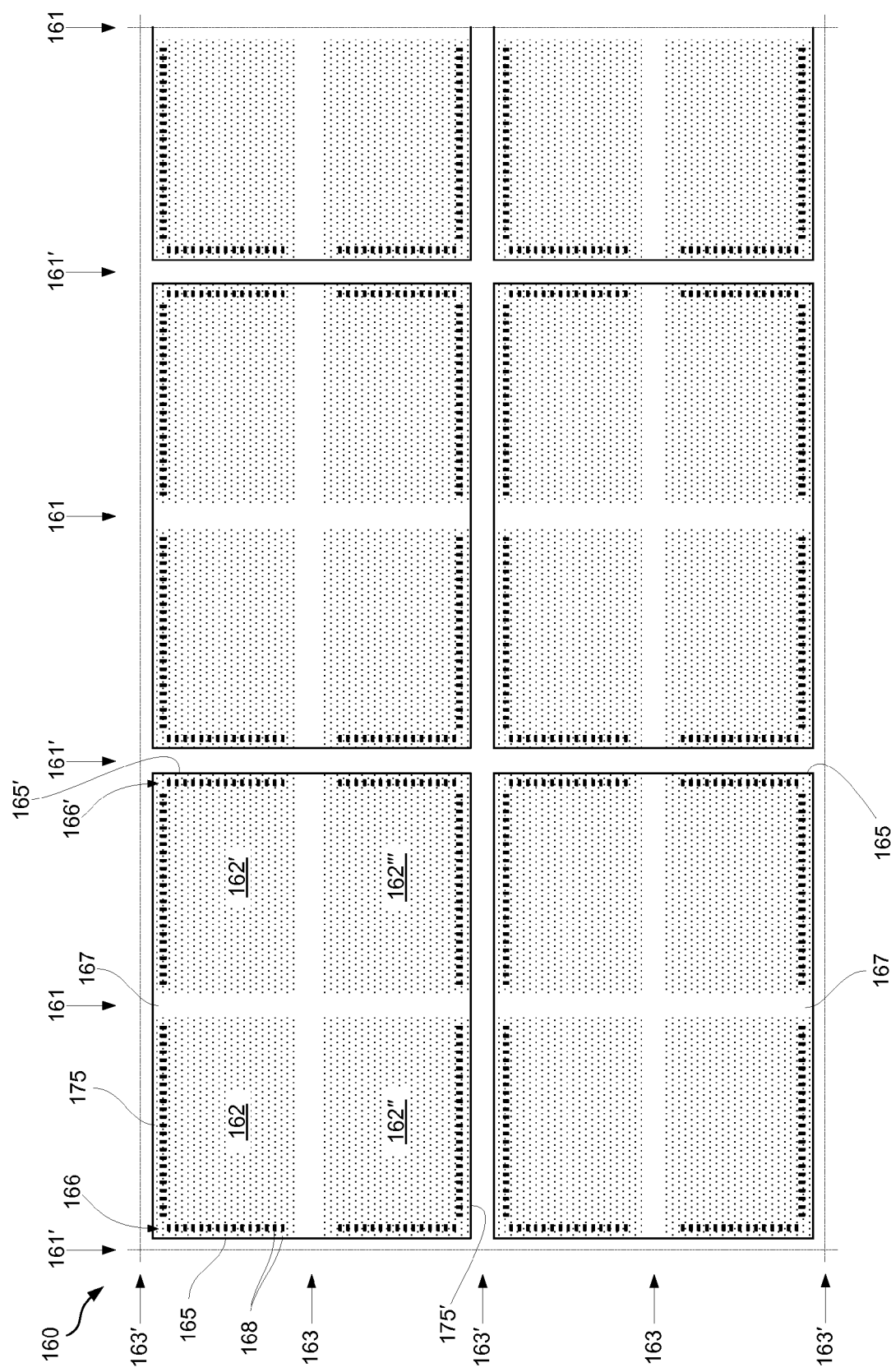

FIGS. 15B and 16B are diagrammatic sketches in a plan view each showing a wafer array formed by performing a first wafer cutting procedure according to an embodiment of the invention, on a wafer as in FIGS. 15A and 16A, respectively.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention. For example, details of the circuitry within the die are omitted.

Turning now to FIG. 12, there is shown in a diagrammatic plan view a portion of a semiconductor wafer 120, such as a silicon wafer, with the active side in view. A number of integrated circuit chips are formed on the wafer, one of which is indicated at 12B. An active region 120 of a chip is shown, bounded by saw streets 121 and 123. Interconnect pads are arrayed in rows alongside opposite edges of the active region of the chip 120 and, accordingly, the chips shown by way of example in FIG. 12 (and other FIGs. herein) are peripheral-pad chips.

FIGS. 13A, 14A show singulated semiconductor die in a portion of an array resulting from sawing a wafer as in FIG. 12 in a conventional manner along streets 121, 123, illustrating die shift; and the portions marked "B" are enlarged in FIGS. 13B, 14B, respectively.

In FIGS. 13A, 13B, the die 130 (and other die in a row between streets 131) has rotated; as a result the die sidewalls along the streets 133 and 131 are no longer parallel, so that the streets 133 and 131 are narrowed at some points and are no longer straight. Moreover, the interconnect pads on the rotated die are no longer arranged in the same pattern as in the uncut wafer.

In FIGS. 14A, 14B, the die 140 (and other die in a row between streets 141, 141') has been displaced (to the right in the FIGs.); as a result the street 141 is wider than in the uncut wafer; and street 141' is narrower than in the uncut wafer. Moreover, the interconnect pads on the displaced die are no longer arranged in the same pattern as in the uncut wafer.

As is apparent in FIGS. 13A, 13B and 14A, 14B, an attempt to pass a cutting tool along the streets, for example to sever a die attach film beneath the die, may result in damage to the shifted die. Moreover, an attempt to address the interconnect pads using a mask or screen or an automated tool (for example, to deposit an electrically conductive bump or glob onto the pads, or to selectively remove an overlying passivation layer) may fail because the pads are no longer located in the expected positions.

According to the invention, die shift is reduced or substantially eliminated, by cutting the wafer in two stages. FIGS. 1A-6B illustrate embodiments in which a first wafer cutting procedure is carried out prior to thinning the wafer to the prescribed die thickness; and FIGS. 7A-11B illustrate an embodiment in which the wafer is thinned to the prescribed die thickness prior to carrying out a first wafer cutting procedure. In the first wafer cutting procedure, cuts are performed along a set of streets to a depth at least as great as the prescribed die thickness; and, optionally, cuts are performed along another set of streets to a depth less than the prescribed die thickness. The result of the first cutting procedure and wafer thinning is an array of rows or blocks of die, where the rows or blocks are separated from one another, while the die within each row or block remain connected by the uncut portion of the wafer in the set of streets that were not cut or were cut to a depth less than the die thickness. The rows or blocks of die are less subject to shift than singulated die would be, primarily in part because they have a greater area of contact with the underlying wafer support.

One or more die preparation procedures can then be carried out on the array of rows or blocks of die. Thereafter, the die are singulated by carrying out a second wafer cutting procedure along the second set of streets, passing completely through the thinned wafer array.

In some instances the die preparation procedure that is carried out following the first cutting procedure requires access to selected die edges or die sidewalls. For example, it may be desirable to apply an electrically insulative coating to an interconnect die edge and/or to a die sidewall adjacent an interconnect die edge, to electrically protect the edge and/or the sidewall in the event of contact with an electrical interconnection wire or tab or trace. Accordingly, during the first wafer cutting procedure in such instances, the first set of streets (where the cutting is performed to a depth at least as great as the die thickness) includes the streets that are fronted by interconnect die edges.

In some instances the die preparation procedure that is carried out following the first cutting procedure includes an operation relating to features on the die, for example the die pads. For example, a previously applied passivation layer may cover the die pads, and for subsequent electrical connection at the pads it is necessary to selectively remove the passivation layer over the pads to reveal the pad surface for electrical contact. Or, for example, it may be desirable to attach an interconnect terminal at selected die pads, to facilitate subsequent electrical connection.

First Wafer Cutting Prior to Wafer Thinning

Turning now to FIG. 1A, there is shown in a diagrammatic plan view a portion of a semiconductor wafer 10, such as a silicon wafer, with the active side in view. A number of integrated circuit chips are formed on the wafer. An active region 12 of a chip is shown, bounded by saw streets 11 and 13. Interconnect pads 18 are arrayed alongside edges of the active region of the chip 12 and, accordingly, the chips shown by way of example in this FIG. (and other FIGs. herein) are peripheral-pad chips. The pads may be located in this manner in the wafer as provided (that is, the original die pads may be suitably arranged peripheral pads); or, rerouting circuitry may connect pads on the wafer as provided to the desired peripheral interconnect locations. In the examples shown in these FIGs., the interconnect pads 18 are arranged in rows near two opposite edges 15 of each chip (e.g., rows 18 of pads 16), and these edges may be referred to for convenience as "interconnect edges". The region 12 of the active side of the die adjacent the interconnect edges, in which the rows 16 of interconnect pads 18 are arranged, may be referred to for convenience as the "interconnect margins". Certain of the saw streets in the wafer are fronted by the interconnect edges or margins. In the examples shown in these FIGs., the streets that are fronted by the interconnect edges or margins (e.g., streets 11) all run parallel in one direction, and the streets not fronted by interconnect edges or margins (e.g., streets 13) run parallel in another direction, perpendicular to the first. The streets 11 fronted by interconnect edges or margins may be referred to for convenience as "N-S streets", and the other streets 13 may be referred to for convenience as "E-W streets". The designations "N-S" and "E-W" herein are arbitrary and are made for convenient reference, and are not related to any particular view of the wafer.

As appears in FIGS. 1B and 1C, the wafer 10 is mounted on a support 19 (a saw chuck, for example) associated with the wafer processing apparatus; at this stage the wafer is mounted with the front side facing away from the support. A dicing tape in a dicing frame, for example, may be placed on the saw chuck, and the wafer may be mounted on the dicing tape; but a tape is not required at this stage, and the wafer may be placed directly on the saw chuck. Referring to FIGS. 1B and 1C, the wafer as provided has a thickness w, which is greater (typically many times greater) than the eventual die thickness d.

The wafer as provided may have any thickness; a typical wafer may have a nominal thickness about 30 mils, or about 760 um. The finished die may in some embodiments have a thickness in a range about 20 um to about 250 um; and the depth of the trenches will be determined according to the desired finished die thickness. In some embodiments, for example, the finished die may have a "standard" thickness, in a range about 120 um to about 250 um; or it may be "thin", having a thickness in a range about 80 um to about 120 um; or it may be "ultra thin", having a thickness in a range about 20 um to about 80 um.

The mounted wafer is subjected to a first cutting procedure in which the wafer is cut (for example by cutting using a dicing saw) along a first set of streets and, optionally, along a second set of streets. FIGS. 2A, 2B, 2C illustrate the result of cutting along a first set of streets 11 (here, the N-S streets) to form parallel trenches 21 in the front side of the wafer to a depth s in the wafer greater than the eventual die thickness d. The trenches define strips, defined by sidewalls 25, each strip including a row of connected die 22. At this stage the strips are connected by the wafer material remaining at the floor of the trenches 21.

FIGS. 3A, 3B, 3C illustrate the result of (optionally) cutting along a second set of streets 13 (here, the E-W streets) to form parallel trenches 33 in the front side of the wafer to a depth in the wafer less than the eventual die thickness. The depth of the shallow cut along the second set of streets may be much less than the eventual die thickness and, in some examples the shallow cut may be nearly zero. The shallow cut defines noninterconnect die edges, at least, and may define partial die noninterconnect sidewalls 37.

The first part and the second part (if employed) of the first wafer cutting procedure may be carried out in any order; that is, the second part may be carried out prior to the first cut, or the first part may be carried out prior to the second part; and not all the cuts along one set of streets need be completed before cuts are completed along the other set of streets.

This shallow cut part of the first cutting procedure may be omitted altogether. However, there may be some advantage to performing a shallow cut to at least define the die edges; particularly, for example where an electrically insulating coating is applied to the array following the first cutting procedure, the coating will be formed over the die edges (and onto the partial die sidewalls) defined by the shallow cut (as well as over the die edges and sidewalls defined by the deeper cut). Thereafter, when a subsequent cut along the second set of streets is carried out, any tearing or shredding of the coating at the cut edge will be located in the shallow trench, rather than at the edge of the die front surface.

Various cutting depths may be specified. In one example, a standard wafer may have a thickness about 29 mil and, where a die thickness of 50 um is desired, the streets fronted by interconnect margins may be cut to a depth about 65 um (about 15 um deeper than the eventual die thickness), and the other streets may be cut to a depth nominally about 15 um, defining die edges along those streets.

Then a support 49 such as a backgrinding tape is applied to the front side of the wafer and, if a dicing tape was used earlier, the dicing tape is removed to expose the back side of the wafer. Then the wafer is thinned, for example by backgrinding, to the eventual die thickness. A resulting construct is shown in FIGS. 4A, 4B, 4C. Because the trenches 21 along the N-S streets were in this example formed to a depth greater than the die thickness, thinning the wafer results in removal of the material remaining in these trenches, so that the result is an array of fully separated parallel strips 44 defined by sidewalls (here, interconnect die sidewalls) 45 and including a row of die 42. An area 41 of the underlying support 49 is exposed between the sidewalls (here, interconnect die sidewalls) 45 that were earlier defined by the deep trenches 21. Some wafer material 43 remains in the second set of streets (here, the E-W streets), because the shallower cut (even where it was carried out) is not deep enough to be exposed by the wafer thinning operation.

Subsequent to the first cutting procedure, the array is mounted on a support such as a backing tape, and the backgrinding tape is removed to expose the front side of the array of thinned and separated strips. A result is shown in FIGS. 5A, 5B, 5C. The backside 42 of the strips 54 is applied to the support 59. Areas 51 of the support 59 are exposed between the strips 54. Each strip includes a row of die 52, which are connected by the remaining portions 43 of wafer material in the streets 13. A die preparation procedure can now be carried out on exposed parts of the array; particularly, any of a variety of procedures can be carried out on features on the front side of the die (such as the interconnect pads), and/or any of a variety of procedures can be carried out on the sidewalls 55 or in the spaces between the strips. For instance, if a die attach film has earlier been applied to the backside of the wafer or the array, the film (not shown in these FIGs.) may be cut by passing a cutting tool (somewhat narrower than the tool employed in the first cutting procedure) through the space defined by the sidewalls 55 between the strips. Or, for instance, if an insulating layer is applied over the array as part of the die preparation procedure, the insulating layer may be selectively opened over die pads, to reveal the pad surfaces for later electrical connection; and, the insulating layer between the strips can be removed by passing a cutting tool (somewhat narrower than the tool employed in the first cutting procedure) through the space defined by the sidewalls 55 between the strips.

As noted above, the shallow cut part of the first cutting procedure (and the resulting stage shown in FIGS. 3A, 3B, 3C) may be omitted altogether. In such embodiments, the array resulting from cutting the wafer along the first set of streets, as shown for example in FIGS. 2A, 2B, 2C can be thinned as follows. A support 49 such as a backgrinding tape is applied to the front side of the wafer and the dicing tape is removed to expose the back side of the wafer. Then the wafer is thinned, for example by backgrinding, to the eventual die thickness. A resulting construct is shown in FIGS. 4D, 4E, 4F. Because the trenches 21 along the N-S streets were in this example formed to a depth greater than the die thickness, thinning the wafer results in removal of the material remaining in these trenches, so that the result is an array of fully separated parallel strips 414 defined by sidewalls (here, interconnect die sidewalls) 415 and including a row of die 412. An area 41 of the underlying support 49 is exposed between the sidewalls (here, interconnect die sidewalls) 415 that were earlier defined by the deep trenches 21. The second set of streets 413 (here, the E-W streets), are not cut through, because the shallower cut (even where it was carried out) is not deep enough to be exposed by the wafer thinning operation.

Subsequent to the thinning procedure, a tape such as a dicing tape is placed onto the back side of the wafer array. Optionally, and in some embodiments preferably, a die attach film is placed onto the back side of the wafer array, and then the tape (dicing tape) is placed on the die attach film. The backgrind tape is then removed to expose the front side of the array of thinned and separated strips. A result, where the shallow cut part of the first cutting procedure is omitted, is shown in FIGS. 5D, 5E, 5F. The backside 412 of the strips 514 is applied to the support 59. Areas 51 of the support 59 are exposed between the strips 514. Each strip includes a row of die 512, which are connected by the wafer material 413 in the streets 13. A die preparation procedure can now be carried out on exposed parts of the array; particularly, any of a variety of procedures can be carried out on features on the front side of the die (such as the interconnect pads), and/or any of a variety of procedures can be carried out on the sidewalls 515 or in the spaces between the strips. For instance, if a die attach film has earlier been applied to the backside of the wafer or the array, the film (not shown in these FIGs.) may be cut by passing a cutting tool (somewhat narrower than the tool employed in the first cutting procedure) through the space defined by the sidewalls 515 between the strips. Or, for instance, if an insulating layer is applied over the array as part of the die preparation procedure, the insulating layer may be selectively opened over die pads, to reveal the pad surfaces for later electrical connection; and, the insulating layer between the strips can be removed by passing a cutting tool (somewhat narrower than the tool employed in the first cutting procedure) through the space defined by the sidewalls 515 between the strips.

Other examples of die preparation procedures that might advantageously be made prior to performing a second wafer cutting procedure are contemplated. These include, for example, mass formation of bumps on die interconnect pads, for example by screen printing; or formation of an under bump metallization on interconnect pads. Where the die preparation procedure requires heating, a heat-resistant tape may be used to support the array.

Figure 6A:
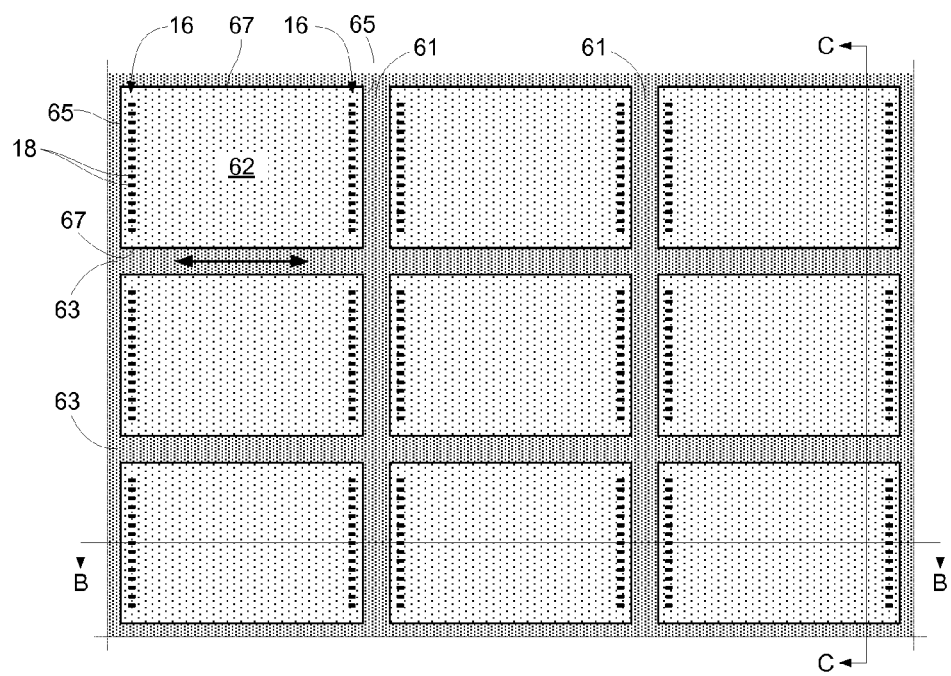
Figure 6C:
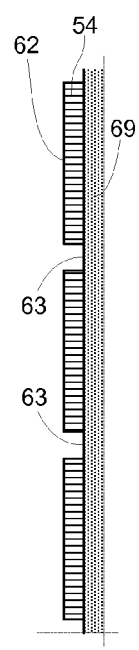
Figure 6B:
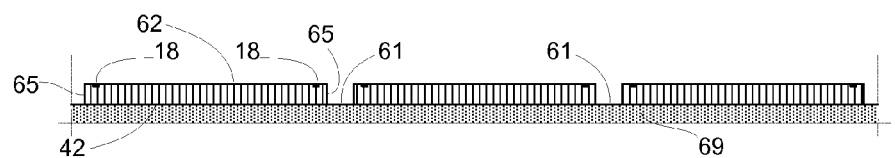

Thereafter singulation of the die is completed in a second cutting procedure, in which the wafer is cut through (either from the front or the backside of the array) to remove wafer material remaining along the second set of streets between the die. A resulting array of singulated die is shown in FIGS. 6A, 6B, 6C. Now the die 62 are defined by sidewalls 67 (here, noninterconnect sidewalls) and by sidewalls 65 (here, interconnect sidewalls). Areas 63 of the support 69, and areas 61 of the support 69, are revealed in the second set of streets between the die 62. The singulated die may be further processed in the array, or they can be removed from the support and manipulated using a pick-and-place tool.

Wafer Thinning Prior to First Wafer Cutting

FIGS. 7A through 11C show stages in an embodiment in which the wafer is thinned to the prescribed die thickness prior to carrying out a first wafer cutting procedure. The stages include: mounting the wafer on a support, such as a backgrind tape applied to the front side of the wafer, and thinning the wafer to the desired die thickness (FIGS. 7A, 7B, 7C); mounting the thinned wafer on a support such as a dicing tape applied to the backside of the thinned wafer, and removing the backgrinding tape to reveal the front side of the thinned wafer (FIGS. 8A, 8B, 8C); performing a first cutting procedure, which includes cutting through to (and slightly into) the support (that is, to a depth s1 at least as great as the die thickness d) in a first set of streets (here, the N-S streets) (FIGS. 9A, 9B, 9C) and (optionally) cutting into the wafer to a depth s2 that is less than (and may be significantly less than) the die thickness d) (FIGS. 10A, 10B, 10C). The result at this stage is an array of strips separated from one another by the trenches formed by the first cutting procedure in the first set of streets (the N-S streets), in which each strip includes a row of die attached (or partly attached) by wafer material remaining in the second set of streets.

Figure 7A:
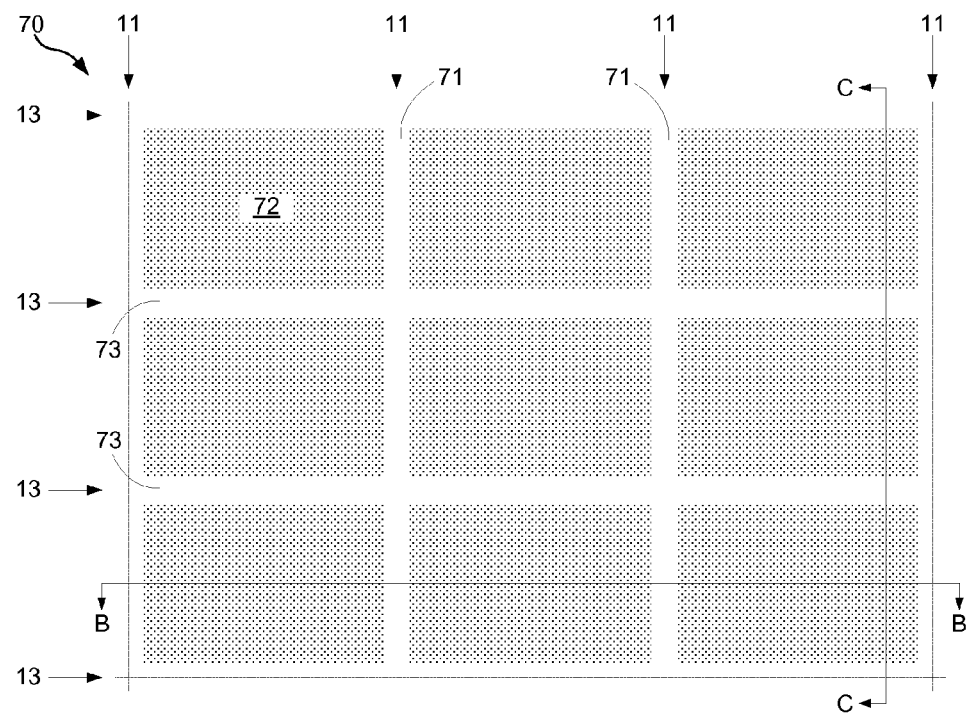
FIGs. 7A-7C; 8A-8C; 9A-9C; 10A-10C; and 11A-11C are diagrammatic sketches showing stages in another embodiment of a process for providing singulated die in a wafer array.
Figure 7C:
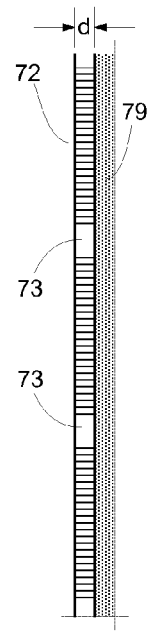
Figure 7B:
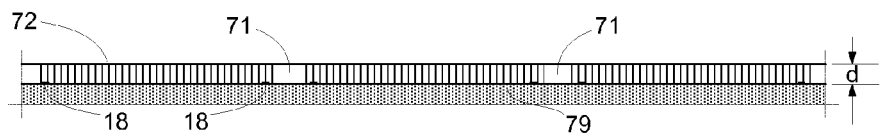

FIGS. 7A, 7B, 7C show a portion 70 of a wafer mounted onto a support 79 such as a backgrind tape applied to the front side of the wafer, and thinned (for example by backgrinding) to the eventual die thickness d. The die 72 are bounded by saw streets 11 and 13; which contain the uncut wafer material 71, 73, respectively. The backside of the thinned wafer is in view in FIG. 7A, and the active sides of the die 72, including the interconnect pads 18, face the support 79.

FIGS. 8A, 8B, 8C show the result of mounting the thinned wafer on a support such as a dicing tape applied to the backside of the thinned wafer, and removing the backgrinding tape to reveal the front side of the thinned wafer.

Figure 9A:
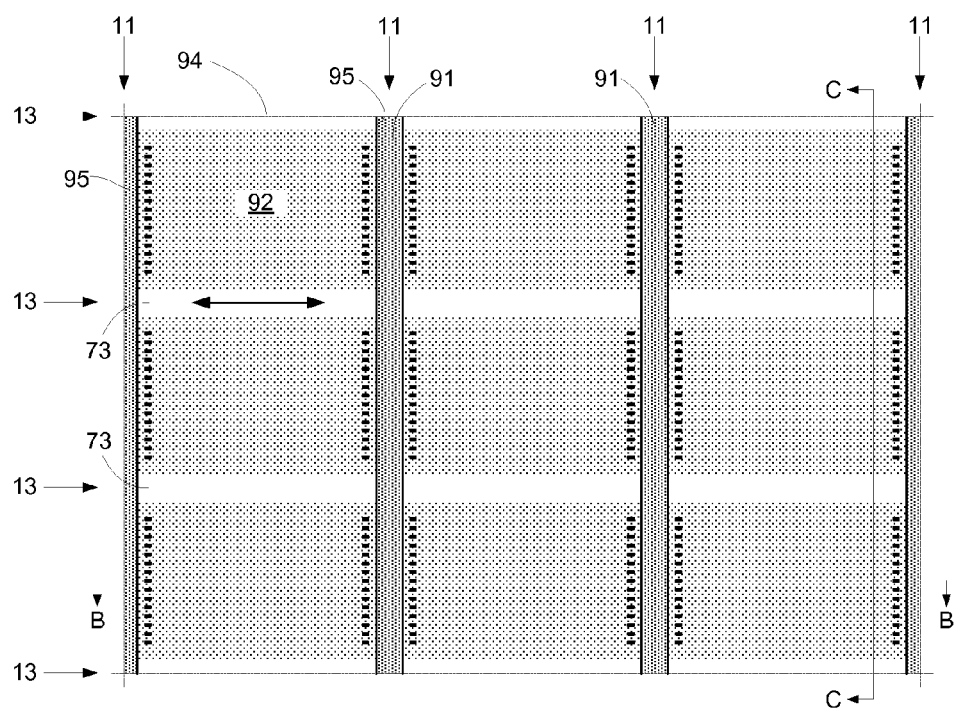
Figure 9C:
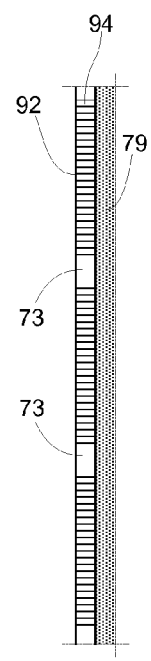
Figure 9B:
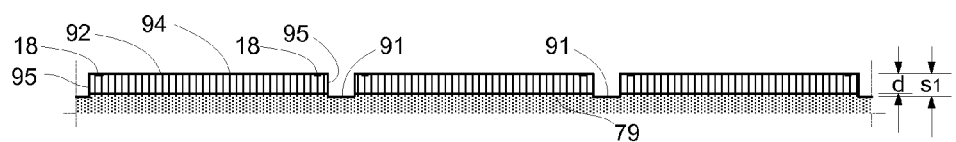

FIGS. 9A, 9B, 9C, 10A, 10B and 10C show the result of a first wafer cutting procedure, in which the wafer is cut (for example by cutting using a dicing saw) along a first set of streets and, optionally, along a second set of streets. FIGS. 9A, 9B, 9C illustrate the result of cutting along a first set of streets 11 (here designated the N-S streets) to form parallel trenches 91 in the front side of the wafer to a depth s1 at least as great as the eventual die thickness d. Because the wafer had earlier been thinned to the eventual die thickness d, the trenches extend through the wafer and to or into the support 79. The trenches define strips, defined by sidewalls 95, each strip including a row 94 of connected die 92. At this stage the strips are separated from one another, and the die 92 are fully connected by the wafer material remaining in the streets 13.

FIGS. 10A, 10B, 10C illustrate the result of (optionally) cutting along a second set of streets 13 (here designated the E-W streets) to form parallel trenches 103 in the front side of the wafer to a depth s2 in the wafer less than the eventual die thickness d. The depth of the shallow cut along the second set of streets may be much less than the eventual die thickness and, in some examples the shallow cut may be nearly zero. The shallow cut defines noninterconnect die edges of the die 102, at least, and may define die noninterconnect partial sidewalls 107.

As noted above, the first wafer cutting procedure may be carried out in phases: in one ("first") phase the wafer is cut along a first set of streets to a depth at least as great as the die thickness, and in another (optional "second") phase the wafer is cut along a second set of streets to a depth less than the die thickness. Where both phases of the first wafer cutting procedure are carried out, they may be carried out in any order; that is, the optional second phase may be carried out prior to the first phase, or the first phase may be carried out prior to the optional second phase; and not all the cuts along one set of streets need be completed before cuts are completed along the other set of streets. And, as noted above, the second phase may be omitted.

Whether or not the optional cutting to form shallower trenches is carried out, a die preparation procedure can now be carried out on exposed parts of the array, as described above; particularly, for example, any of a variety of procedures can be carried out on features on the front side of the die (such as the interconnect pads), and/or any of a variety of procedures can be carried out on the sidewalls or in the spaces between the strips. Examples are given above.

Following the die preparation procedure the die may be singulated by cutting through the wafer to a depth s3 at least as great as the die thickness d in the second set of streets (here, the E-W streets) (FIGS. 11A, 11B, 11C). Because the wafer had earlier been thinned to the eventual die thickness d, the trenches extend through the wafer and to or into the support 79, as shown at 113. The singulated die 112 may be further processed in the array, or they can be removed from the support and manipulated using a pick-and-place tool.

In the foregoing examples, the die have interconnect pads arrayed in rows alongside two opposite edges of the active region; that is, each die has two opposite interconnect edges. In other embodiments the die may have interconnect pads arrayed alongside only one edge; that is, each die may have only one interconnect edge. Or, in still other embodiments the die may have interconnect pads arrayed alongside two adjacent edges; that is, each die may have two interconnect edges that meet at a corner of the die. The pads may be located in this manner in the wafer as provided (that is, the original die pads may be suitably arranged peripheral pads); or, rerouting circuitry may connect pads on the wafer as provided to the desired peripheral interconnect locations.

FIG. 15A shows a portion 150 of a wafer on which each die has one interconnect edge. The active regions of the die are bounded by saw streets 151, 151' running parallel in one direction, and by saw streets 153, running parallel in another direction, perpendicular to the first. The streets 151, 151' may be referred to for convenience as "N-S streets" and the streets 153 may be referred to for convenience as "E-W streets". Interconnect pads 158 are arrayed in a row 156 along an edge of the active region of each die 152, defining interconnect edge 155; and interconnect pads 158' are arrayed in a row 156' along an edge of the active region of each die 152', defining interconnect edge 155'. In this example, the respective interconnect edges of neighboring die 152, 152', face in opposite directions; accordingly, streets 151' are fronted on both sides by interconnect edges 155', and streets 151 and 153 are fronted by non-interconnect edges.

In such an arrangement, a first cutting procedure may be carried out in streets 151', and alternating parallel streets 151 are left uncut. In the terminology used in the foregoing examples, the streets 151' constitute a first set of streets, and the remaining streets constitute a second set of streets. A result is shown in FIG. 15B. As in the foregoing examples, the first cutting procedure forms parallel trenches in the front side of the wafer to a depth greater than the eventual die thickness. The trenches define strips 157, defined by interconnect sidewalls 159, each strip including two rows of connected die 152, 152'. In embodiments where the wafer is thinned prior to the first cutting procedure, the trenches pass through the thinned wafer to (and to some extent into) the wafer support, and the first cutting procedure results in an array of fully separated parallel strips. In embodiments where the first cutting procedure precedes wafer thinning, the result of thinning is an array of fully separated parallel strips 157. Strips containing two rows of connected die are wider than strips containing only one row of connected die, and they therefore have a greater area of contact with the support. Strips having a greater area of contact with the support may be less likely to shift during a subsequent operation on the array.

The first cutting procedure may be complete at this stage; or, as in the foregoing examples, a shallower cut may optionally be made along some or all of the remaining streets. Die singulation results from carrying out a second cutting procedure, to remove wafer material remaining along the remaining streets.

FIG. 16A shows a portion 160 of a wafer on which each die has two adjacent interconnect edges, that is, on two edges that meet on each die at a corner of the die. The active regions of the die are bounded by saw streets 161, 161' running parallel in one direction, and by saw streets 163, 163' running parallel in another direction, perpendicular to the first. The streets 161, 161' may be referred to for convenience as "N-S streets" and the streets 163, 163' may be referred to for convenience as "E-W streets". Interconnect pads 168 are arrayed in a row 166 along an edge of the active region of each die 162, 162", defining interconnect edges 165; and, similarly, interconnect pads are arrayed in a row 166' along an edge of the active region of each die 162', 162''', defining interconnect edges 165'. Interconnect pads 178 are arrayed in a row 176 along an edge of the active region of each die 162, 162', defining interconnect edges 175; and, similarly, interconnect pads are arrayed in a row 176' along an edge of the active region of each die 162", 162''', defining interconnect edge 175'. As the FIG. illustrates, each die has an interconnect edge fronting a N-S street 161' and an interconnect edge fronting an E-W street 163'. In this example, the respective interconnect edges 165, 165', of neighboring die 162, 162', face in opposite directions, and the respective interconnect edges 175, 175', of neighboring die 162, 162", face in opposite directions; accordingly, streets 161', 163' are fronted on both sides by interconnect edges, and streets 161 and 163 are fronted by non-interconnect edges.

In such an arrangement, a first cutting procedure may be carried out in streets 161', 163', and alternating parallel streets, respectively 161, 163, are left uncut or are only partially cut. In the terminology used in the foregoing examples, the streets 161', 163' constitute a first set of streets, and the remaining streets constitute a second set of streets. A result is shown in FIG. 16B. As in the foregoing examples, the first cutting procedure forms parallel trenches in perpendicular directions in the front side of the wafer to a depth greater than the eventual die thickness. The trenches define blocks 167, defined by interconnect sidewalls 165, 165' and 175, 175', each block including four connected die 162, 162', 162", 162'''. In embodiments where the wafer is thinned prior to the first cutting procedure, the trenches pass through the thinned wafer to (and to some extent into) the wafer support, and the first cutting procedure results in an array of fully separated blocks. In embodiments where the first cutting procedure precedes wafer thinning, the result of thinning is an array of fully separated blocks 167. Blocks containing four connected die have a greater area of contact with the support than a single die, and blocks having a greater area of contact with the support may be less likely to shift during a subsequent operation on the array.

The first cutting procedure may be complete at this stage; or, as in the foregoing examples, a shallower cut may optionally be made along some or all of the remaining streets. Die singulation results from carrying out a second cutting procedure, to remove wafer material remaining along the remaining streets.

EXAMPLE

First Wafer Cutting Prior to Wafer Thinning; Coated Die Surface and Die Attach Film The following example illustrates in detail steps in a die separation process in which at least some die surfaces have an electrically insulative polymer coating, and the die are provided with a die attach film.

The process begins with a semiconductor wafer, containing semiconductor circuitry defining active die regions bounded by saw streets. Each active die region has interconnect pads situated along at least one edge (an "interconnect edge"). The pads may be so situated in the wafer as provided from the fab; or, rerouting circuitry may be formed on the wafer as provided, to connect the original die pads to interconnect pads situated along one or more interconnect edges. For example, the die in the wafer as provided may be center pad die. Or, where the die in the wafer as provided are peripheral pad die, the pads may not be suitably arranged for the end use: the pads may not be situated on the desired interconnect edge; or the pads may be situated too close together for the desired interconnect technique.

The wafer is then subjected to the first cutting procedure. As outlined above, the first cutting procedure includes a first part, in which cuts are made in a first set of streets which are fronted by interconnect die edges, from the front side of the wafer to a depth at least as great as the eventual die thickness. It may be advantageous to take some care in selecting cutting parameters, particularly the cut width and the cut depth.

Generally, the saw kerf must be narrower than the street width. The cut width is a process parameter, and where it is desirable to have the die pads close to the resulting die edge, the cut should be made as wide as possible, but not so wide that the cut may damage the die seal at the die edges. The street width is determined by specification or by direct measurement, and a narrower saw blade is selected; according to one standard rule, the blade width is preferably about 35 um less than the street width, and is preferably at least about equal to and usually greater than half the street width. For example, for a street width of 80 um, a blade providing a cut width at least 40 um wide and less than 50 um is selected; a "DF" blade, providing a cut width in the range 40-50 um (nominally, 45 um wide), may be suitable for this requirement.

As noted above, the trenches resulting from the cuts in the first set of streets must be deep enough so that the subsequent wafer thinning fully separates the strips or blocks of connected die; that is, the cut depth must be at least as great as the eventual die thickness. In a conventional "dice-before-grind" die singulation process, the cut is typically made to a depth about 50 um deeper than the eventual die thickness; that is, for a 50 um thick die, the cut would be made to a depth about 100 um in the wafer (a 50 um "overcut"). For such a conventional cut, backgrinding continues through as much as 50 um of the wafer after the trenches are encountered. The backgrinding tool imposes stresses on the wafer during the thinning procedure, and as soon as the trenches (or some of them) are encountered during backgrinding, these stresses may tend to force the resulting separated strips of blocks of die out of alignment. Accordingly, it may be advantageous to limit the backgrinding time to near the minimum required to encounter all the trenches and effect separation of all of the strips or blocks, to limit the amount of wafer material that must be ground away after all the trenches are encountered. This can be accomplished according to the invention by limiting the cut depth to near the eventual die thickness, that is, by limiting the overcut. The cut depth should exceed the eventual die thickness by only a small amount, to accommodate any variation in the actual cut and in the thickness of the wafer after backgrinding. This may be accomplished by programming the dicing saw to cut to a target depth only slightly deeper (such as 15 um) than the die thickness. For example, for a desired die thickness about 50 um, the saw may be set to cut to a depth about 65 um (a 15 um overcut).

The cutting height may be indexed in any of a variety of ways. In a conventional approach, the saw is set to cut to a specified height above the cutting table. The cutting height is determined by subtracting the desired cut depth from the overall thickness of the wafer plus dicing tape. Then the saw is set to cut to the cutting height. For example, in a conventional approach, where the wafer has a thickness about 760 um, and it is mounted on a dicing tape having a thickness about 110 um, the total thickness of the wafer plus tape is 870 um; for a desired die thickness of 50 um and a desired 50 um overcut, the blade height is programmed to 770 um over the cutting table. Typically a 50 um overcut is required when the cutting height is indexed to the cutting table, to compensate for greater variations in thickness; and a 15 um overcut may not be reliably achievable using this conventional approach.

In an alternative approach, which may be preferred, the cut depth is indexed from the front side of the wafer, rather than from the cutting table. This capability may be provided in programmable saws made by, for example, Disco Corporation (Japan). In one approach, the wafer is placed on the cutting table, and a test cut is made near the edge of the wafer. A noncontact device, such as one made by, for example, Keyence Corporation (Japan), is used to measure the depth of the test cut, to calibrate the apparatus. Then the saw is programmed to cut to the desired depth below the wafer front side surface. The apparatus may be programmed to recalibrate at various intervals during the first cutting procedure (as frequently as following completion of the cut along each street, for example).

As described above, the trenches formed by the cuts along streets fronted by interconnect edges define interconnect sidewalls adjacent interconnect edges along which the die pads are arrayed. The front side of the die and the interconnect edges and sidewalls are thus made available for further treatment.

Optionally, as outlined above, a second part of the first cutting procedure may be carried out, constituting making cuts along streets not fronted by interconnect edges, to a depth less than the eventual die thickness. A shallow trench depth about 15 um may be suitable. Where this procedure is carried out, the resulting shallower trenches define noninterconnect edges, and partial noninterconnect sidewalls, which are thus additionally made available for further treatment.

Because according to the invention the die are not singulated by the first cutting procedure, it may not be necessary to mount the wafer on a dicing tape prior to the first cutting procedure. On the other hand, a dicing tape may protect the back side of the wafer array during subsequent treatment. If a dicing tape is desired, the wafer is mounted onto a dicing tape, and the dicing tape is mounted onto a film frame (for example, a dicing ring), prior to carrying out the first cutting procedure. Following the first cutting procedure, the dicing tape is cut between the outer edge of the wafer and the inner edge of the frame, to free the wafer from the film frame while leaving the dicing tape on the back side of the wafer.

After the first cutting procedure is complete, features exposed on the wafer by the first cutting procedure may be subject to a die preparation procedure. In this example, a parylene coating is applied to all the exposed surfaces of the partially cut wafer.

A standard parylene process is employed. The partially cut wafer may be plasma cleaned (for example, using an oxygen plasma), and an adhesion promoter may be applied to ensure good adhesion of the parylene to the surfaces. Suitable adhesion promoters include, for example, any of various "silane" adhesion promoters; a methacryloxy silane such as one marketed under the name "Silquest", e.g., "Silquest A-174". The partially cut wafer, preferably having the back side protected by a tape (for example, a dicing tape) is placed in the parylene chamber, and parylene is deposited on all the exposed surfaces, including the front side, the walls and floors of the deeper trenches, and the walls and sides of the optional shallower trenches (if present). The parylene deposition process results in a generally uniform conformal coating on all exposed surfaces. The thickness of the resulting coating can be controlled by, for example, controlling the process time. The parylene process is carried out to provide a continuous coating, preferably free of pinholes. In various examples various parylene thicknesses have been used; a coating of parylene C having a thickness about 2.5 um may suffice, for example. In other examples coating thicknesses about 10 um have been used.

Thicker parylene coatings (such as 10 um) may be torn by a saw cut made following parylene deposition. The protective value of the parylene may be compromised by a tear in the coating near a die edge. Tears at the floor of a trench may not have a detrimental effect and, accordingly, where such a thicker parylene coating is used, cutting to form shallower trenches may be advantageous. On the other hand, thinner parylene coatings (such as 2.5 um) are less likely to be torn by the saw cut and, where a thinner parylene coating is used, a second phase of the first cutting procedure may be unnecessary.

As noted above, the parylene process results in deposition of parylene on all exposed surfaces, and the parylene precursor molecules can invade very thin spaces. Parylene on the back side of the wafer can interfere with a subsequent backgrinding process, by loading the grinding wheel. Accordingly, it may be advantageous to protect the back side of the wafer (for example, by leaving a tape in place until the parylene process is complete), so that no parylene forms there. After the parylene process has been completed, the dicing tape (where present) may be removed from the back side of the wafer.

One or more additional die preparation procedures may be carried out. Particularly, where, as in this example, interconnect pads are obscured by the parylene coating on all the exposed surfaces of the partially cut wafer, the pads at which electrical interconnection of the die is to be made must be exposed. A particularly suitable technique for exposing pads is laser ablation, and this can advantageously be carried out at a wafer array stage, before the die have been singulated, so that the die have not shifted and the die (and the pads) are properly aligned. The laser apparatus can be set up and aligned, and then robotically stepped from pad to pad and from die to die.

Following the die preparation procedure(s) a wafer thinning procedure can be conducted, for example by backgrinding using selected grinding wheels (cups, discs). The wafer is mounted onto a grinding tape, by applying the tape to the (parylene coated, in this example) front side of the wafer. Once the dicing tape (where one was used) has been removed, the back side of the wafer is exposed for backgrinding.

It may be advantageous to follow a particular protocol for the backgrinding. The protocol in this example is directed to minimizing mechanical impact of the grinding wheel on the wafer and on the wafer array during the thinning operation, to minimize shifting of the strips or blocks, or die, in the array and to minimize propagation of stress through the wafer. It may be preferred to carry out the thinning procedure in stages: in this example a first stage employs a coarse grinding wheel (for example a 320 grit); a second stage employs a finer vitrified grinding wheel (for example a vitrified 4800 grit); and a third stage employs a polishing wheel. A vitrified (vitreous inorganic fiber) wheel is available from, for example, Disco Corporation (Japan). Separation of the strips or blocks of die occurs during the second stage, when mechanical impact is reduced by use of the vitrified wheel.

In this example, a die attach film is applied to the polished back side of the thinned wafer. Preferred die attach films include films available from Hitachi (e.g., FH 900) or from Nitto (e.g., EM 500, EM 700), for example, and the film may be permitted to "set" for a time (for example at least about 4 hours) to ensure reliable adhesion to the wafer array and, particularly, to minimize die shift during removal of the grinding tape from the front side.

Once the die attach film has sufficiently set, the grinding tape is removed by peeling it away. In a conventional grinding tape removal, the tape is peeled from the die in a corner-to-corner direction, for example in a direction at about a 45° angle with respect to the die edges. In this example, the tape is preferably removed by peeling in a direction parallel to the interconnect edge streets (or, for die blocks, parallel to longer interconnect edges), to minimize sideways stresses on the strips or blocks.

Then the die attach film is cut in the deep trenches fronted by interconnect edges. Because array shift has been minimized, the die attach film cut can confidently be made without damaging the die or the parylene film (where present) on the interconnect die sidewalls. Where a saw is used for this cut the saw must be narrow enough so that it does not impact the die or the parylene film (where present) on the interconnect sidewalls. As may be appreciated, thicker parylene films will occupy a greater portion of the street width, and this will require a thinner saw. Also, it may be advantageous to refine the control of the saw for the die attach film cut. In a conventional saw procedure, the saw is aligned for a first cut, and is thereafter stepped across the wafer from street to street, relying for proper alignment on the specified step interval. In one refinement, the saw may be realigned/recalibrated before cutting at selected ones or all of the streets using fiducials associated with each street. In another refinement, a number of measurements may be made in or on the street, and the data may be treated statistically to determine a best saw path for the street.

Then a second wafer cutting procedure is carried out, to cut all the way through the wafer material remaining in the streets not fronted by interconnect die edges, and through the die attach film below these streets, resulting in singulated die. The singulated die array is now ready for further treatment, including for example, removal and placement using a pick-and-place tool.

Other embodiments are within the claims.

We claim:

1. A method for preparing singulated semiconductor die, comprising
   providing a wafer having a front side in which semiconductor chip active regions are formed, the active regions being bounded by saw streets, the active regions having interconnect pads arranged in an interconnect margin along an interconnect edge thereof, the wafer having a thickness greater than a prescribed die thickness;
   performing a first wafer cutting procedure, wherein cuts are made along a first set of streets from the front side to a depth at least as great as the prescribed die thickness;
   carrying out a die preparation procedure;
   thinning the wafer to the prescribed die thickness; and
   performing a second wafer cutting procedure along a second set of streets, passing completely through the wafer.

2. The method of claim 1, wherein the first wafer cutting procedure further comprises making cuts along the second set of streets to a depth less than the prescribed die thickness.

3. The method of claim 2 wherein the first wafer cutting procedure defines die edges, and die sidewalls.

4. The method of claim 1 wherein the first wafer cutting procedure defines die edges and die sidewalls.

5. The method of claim 1 wherein the first set of streets includes streets fronted by interconnect die edges, and wherein the first wafer cutting procedure defines interconnect edges and interconnect sidewalls.

6. The method of claim 5 wherein the die preparation procedure includes applying an electrical insulation onto at least the interconnect edges.

7. The method of claim 5 wherein the die preparation procedure includes applying an electrical insulation onto at least the interconnect sidewalls.

8. The method of claim 1 wherein the die preparation procedure includes applying an electrical insulation onto a wafer surface.

9. The method of claim 1 wherein thinning the wafer results in an array of separate strips of connected die.

10. The method of claim 1 wherein thinning the wafer results in an array of separate blocks of connected die.

11. The method of claim 1, further comprising applying an electrically insulating layer onto a backside of the thinned wafer.

12. The method of claim 1 wherein thinning the wafer is carried out prior to performing the second wafer cutting procedure.

13. The method of claim 1 wherein performing the second wafer cutting procedure is carried out prior to thinning the wafer.

14. A method for preparing singulated semiconductor die, comprising
    providing a wafer having a front side in which semiconductor chip active regions are formed, the active regions being bounded by saw streets, the active regions having interconnect pads arranged in an interconnect margin along an interconnect edge thereof;
    thinning the wafer to a prescribed die thickness;
    performing a first wafer cutting procedure, wherein cuts are made along a first set of streets from the front side to a depth at least as great as the prescribed die thickness;
    carrying out a die preparation procedure; and
    performing a second wafer cutting procedure along a second set of streets, passing completely through the thinned wafer.

15. The method of claim 14, wherein the first wafer cutting procedure further comprises making cuts along the second set of streets to a depth less than the prescribed die thickness.

16. The method of claim 15 wherein the first wafer cutting procedure defines die edges and die sidewalls.

17. The method of claim 14 wherein the first wafer cutting procedure defines die edges and die sidewalls.

18. The method of claim 14 wherein the first set of streets includes streets fronted by interconnect die edges, and wherein the first cutting procedure defines interconnect edges and interconnect sidewalls.

19. The method of claim 18 wherein the die preparation procedure includes applying an electrical insulation onto at least the interconnect edges.

20. The method of claim 18 wherein the die preparation procedure includes applying an electrical insulation onto at least the interconnect sidewalls.

21. The method of claim 14 wherein the die preparation procedure includes applying an electrical insulation onto a wafer surface.

22. The method of claim 14 wherein performing the first wafer cutting procedure results in an array of separate strips of connected die.

23. The method of claim 22 wherein performing the first wafer cutting procedure results in an array of separate blocks of connected die.

24. The method of claim 14, further comprising applying an electrically insulating layer onto a backside of the thinned wafer.

* * * * *